United States Patent
Kang

(10) Patent No.: US 6,721,199 B2
(45) Date of Patent: Apr. 13, 2004

(54) NONVOLATILE FERROELECTRIC MEMORY DEVICE AND METHOD FOR OPERATING MAIN BITLINE LOAD CONTROLLER THEREOF

(75) Inventor: Hee Bok Kang, Daejon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/307,950

(22) Filed: Dec. 3, 2002

(65) Prior Publication Data
US 2003/0103373 A1 Jun. 5, 2003

(30) Foreign Application Priority Data
Dec. 5, 2001 (KR) .................................. 10-2001-76687

(51) Int. Cl.[7] .............................................. G11C 11/22
(52) U.S. Cl. .................. 365/145; 365/149; 365/189.11
(58) Field of Search ................................ 365/149, 145, 365/189.09, 189.11

(56) References Cited

U.S. PATENT DOCUMENTS

| | | |
|---|---|---|
| 5,991,225 A | 11/1999 | Forbes et al. |
| 6,091,624 A | 7/2000 | Kang |
| 6,141,238 A | 10/2000 | Forbes et al. |
| 6,151,242 A | 11/2000 | Takashima |
| 6,215,692 B1 | 4/2001 | Kang |
| 6,240,007 B1 | 5/2001 | Kang |
| 6,285,576 B1 | 9/2001 | Kang |
| 6,320,783 B1 | 11/2001 | Kang et al. |
| 6,594,174 B2 * | 7/2003 | Choi et al. .................. 365/145 |

* cited by examiner

Primary Examiner—Son Mai
(74) Attorney, Agent, or Firm—Birch, Stewart, Kolasch & Birch, LLP

(57) ABSTRACT

A nonvolatile ferroelectric memory device and a method for operating a main bitline load controller thereof are provided, which improve a sensing voltage margin of a main bitline. The main bitline sensing voltage margin depends on the location of the main bitline load controller. In a first method of arranging the main bitline load controller, the main bitline load controller includes one end connected with the main bitline and the other end connected with a high level line, and is respectively arranged in lower and upper areas of sub cell array blocks. In a second method, the main bitline load controller is additionally arranged in an intermediate area of the sub cell array blocks in addition to the lower and upper areas. In a third method thereof, a number of main bitline load controllers are additionally arranged in intermediate areas of the sub cell array blocks so that at least two sub cell array blocks are arranged between the respective main bitline load controllers.

22 Claims, 21 Drawing Sheets

NONVOLATILE FERROELECTRIC MEMORY DEVICE AND METHOD FOR OPERATING MAIN BITLINE LOAD CONTROLLER THEREOF

This application claims, under 35 U.S.C. §119, the benefit of Korean Patent Application No. P2001-76687 filed on Dec. 5, 2001, which is hereby incorporated by reference.

BACKGROUND OF THE INVENTION

1. Field of the Invention

The present invention relates to a semiconductor memory, and more particularly, to a nonvolatile ferroelectric memory device and a method for operating a main bitline load controller thereof, which improve a sensing voltage margin of a main bitline.

2. Discussion of the Related Art

Generally, a nonvolatile ferroelectric memory, i.e., a ferroelectric random access memory (FRAM) has a data processing speed equal to a dynamic random access memory (DRAM) and retains data even in power off states. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 illustrates a hysteresis loop of a general ferroelectric memory. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory will be described with reference to the accompanying drawings.

FIG. 2 is a schematic diagram of a unit cell of a general nonvolatile ferroelectric memory device. As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and a second terminal is connected with the plate line P/L.

In case where the related art nonvolatile ferroelectric memory device includes a plurality of main bitlines and a plurality of sub bitlines connected to the main bitlines, a main bitline load controller is arranged near a sensing amplifier.

FIG. 3A illustrates a timing diagram of a write mode operation of the related art ferroelectric memory and FIG. 3B illustrates a timing diagram of a read mode operation of the related art ferroelectric memory.

During the write mode, an externally applied chip enable signal CSBpad is activated from the high state to the low state. At the same time, if a write enable signal WEBpad is applied from the high state to the low state, the write mode starts. Subsequently, if an address decoding in the write mode starts, a pulse applied to a corresponding wordline is transited from the low state to the high state to select a cell. A high signal in a certain period and a low signal in a certain period are sequentially applied to a corresponding plate line in a period where the wordline is maintained at the high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. On the other hand, a low signal is applied to the bitline, and if the signal applied to the plate line is high, a logic value "0" is written in the ferroelectric capacitor.

The reading operation of data stored in a cell by the above operation of the write mode will now be described.

If an externally applied chip enable signal CSBpad is activated from the high state to the low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data Qs corresponding to the logic value "1" stored in the ferroelectric memory. If the logic value "0" is stored in the ferroelectric memory, the corresponding data Qns is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in the hysteresis loop of FIG. 1. If the data is not destroyed, the "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the original data, the plate line becomes inactive from the high state to the low state in a state that the high signal is applied to the corresponding wordline. The aforementioned related art nonvolatile ferroelectric memory device has several problems.

Since the single main bitline load controller is arranged near the sensing amplifier, the main bitline sensing voltage is reduced by the resistance component of the main bitline. For this reason, a problem arises in that the entire sensing margin is reduced.

SUMMARY OF THE INVENTION

Accordingly, the present invention is directed to a nonvolatile ferroelectric memory device and a method for operating a main bitline load controller thereof that substantially obviate one or more problems due to limitations and disadvantages of the related art.

An object of the present invention is to provide a nonvolatile ferroelectric memory device and a method for operating a main bitline load controller thereof that improve a sensing voltage margin of a main bitline.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a nonvolatile ferroelectric memory device according to an embodiment of the invention includes a plurality of cell array blocks provided with a plurality of sub cell array blocks having a plurality of unit cells, a plurality of main bitlines arranged in the sub cell array blocks in one direction for each unit of column, a plurality of sub bitlines connected with the unit cells to induce a voltage in the unit cells and arranged along the main bitlines, a plurality of main bitline load controllers respectively arranged at least in the uppermost area and the lowest area of the sub cell array blocks so that one end of each of the main bitline load controllers is connected with the main bitline and the other end of each of the main bitline load controllers is connected with a high level applying terminal, a sensing amplifier block including a plurality of sensing amplifiers commonly used in the cell array blocks and amplifying signals of the main bitlines, and switching transistors arranged one per sub bitline to sense data values of the unit cells using current by varying a current flow depending on the voltage induced in the sub bitline and a voltage transferred to the main bitlines.

In another aspect of the present invention, a method for operating a main bitline load controller of a nonvolatile ferroelectric memory device, includes the steps of: preparing the nonvolatile ferroelectric memory device which includes a plurality of sub cell array blocks having a plurality of unit cells, and a plurality of cell array blocks provided with main bitline load controllers driven by a main bitline load control signal at the uppermost and lowest areas of the sub cell array blocks; selecting a cell driving area; and turning on at least one main bitline load controller nearest to the sub cell array block corresponding to the selected cell driving area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

In the present invention, a cell array includes one or more sub bitlines SBLs, and one or more main bitlines MBLs. A sensing voltage of the sub bitline SBL is changed to an electric current level of an NMOS transistor connected to the main bitline MBL. The changed MBL current level induces the MBL sensing voltage by a current load PMOS device connected to the MBL. The induced MBL sensing voltage is used as an input signal of a sensing amplifier S/A.

The main bitline sensing voltage margin is changed by a method for operating a main bitline load controller. That is, the main bitline sensing voltage margin depends on the location of the main bitline load controller due to the resistance component of the main bitline.

In the present invention, a plurality of main bitline load controllers are arranged in the cell array so that the main bitline load controller nearest to the operation of a particular cell is operated, thereby efficiently reducing the resistance component effect of the main bitline. Particularly, if the resistance of the main bitline is high, it is possible to more efficiently reduce the resistance component effect.

As described above, in the present invention, it is intended to obtain the same sensing margin anywhere in the semiconductor memory device without reducing the main bitline sensing voltage by the main bitline resistance component.

A nonvolatile ferroelectric memory device and a method for operating a main bitline load controller thereof according to an embodiment of the invention will be described with reference to the accompanying drawings.

Figure 1:
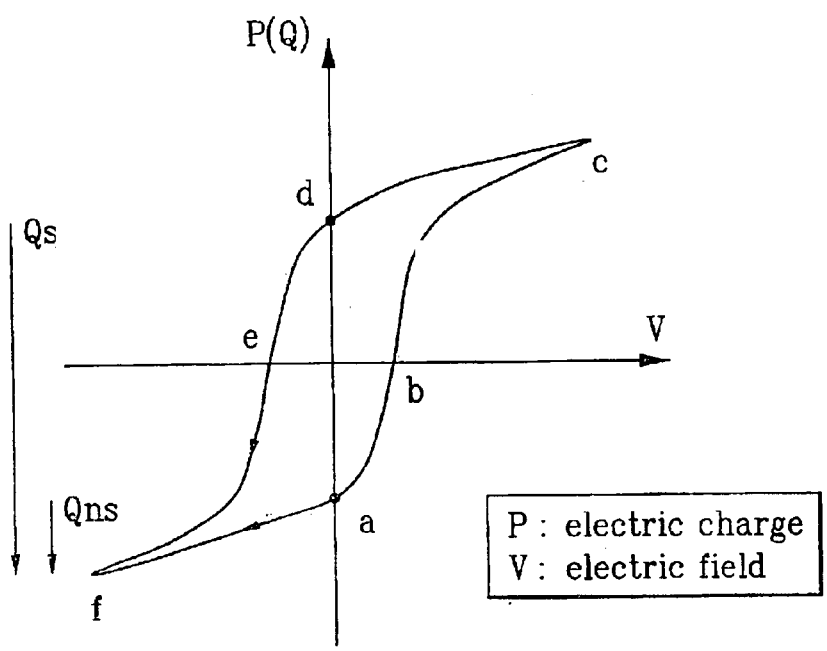
FIG. 1 illustrates a hysteresis loop of a general nonvolatile ferroelectric memory device.
Figure 2:
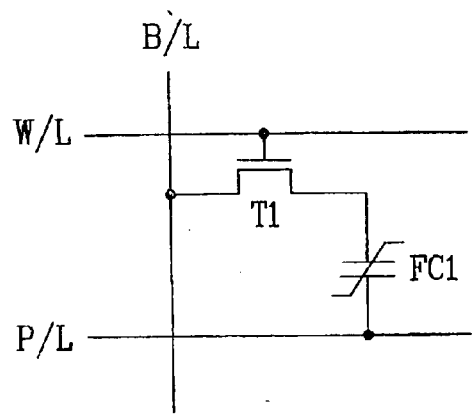
FIG. 2 is a schematic diagram of a unit cell of a general nonvolatile ferroelectric memory device.
Figure 3A:
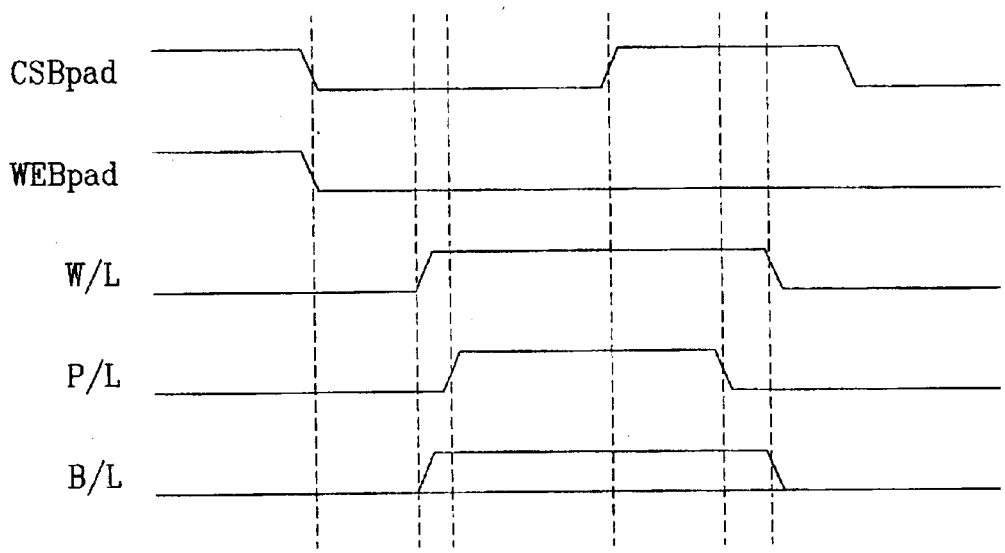
FIG. 3A illustrates a timing diagram of a write mode operation of a related art ferroelectric memory.
Figure 3B:
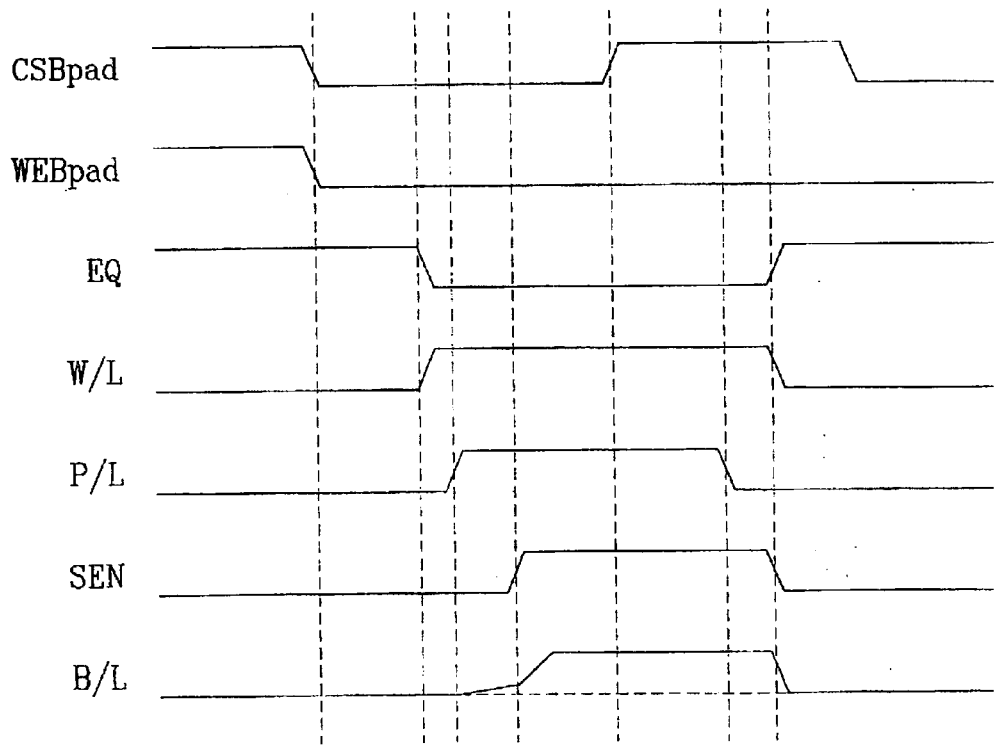
FIG. 3B illustrates a timing diagram of a read mode operation of the related art ferroelectric memory.
Figure 4A:
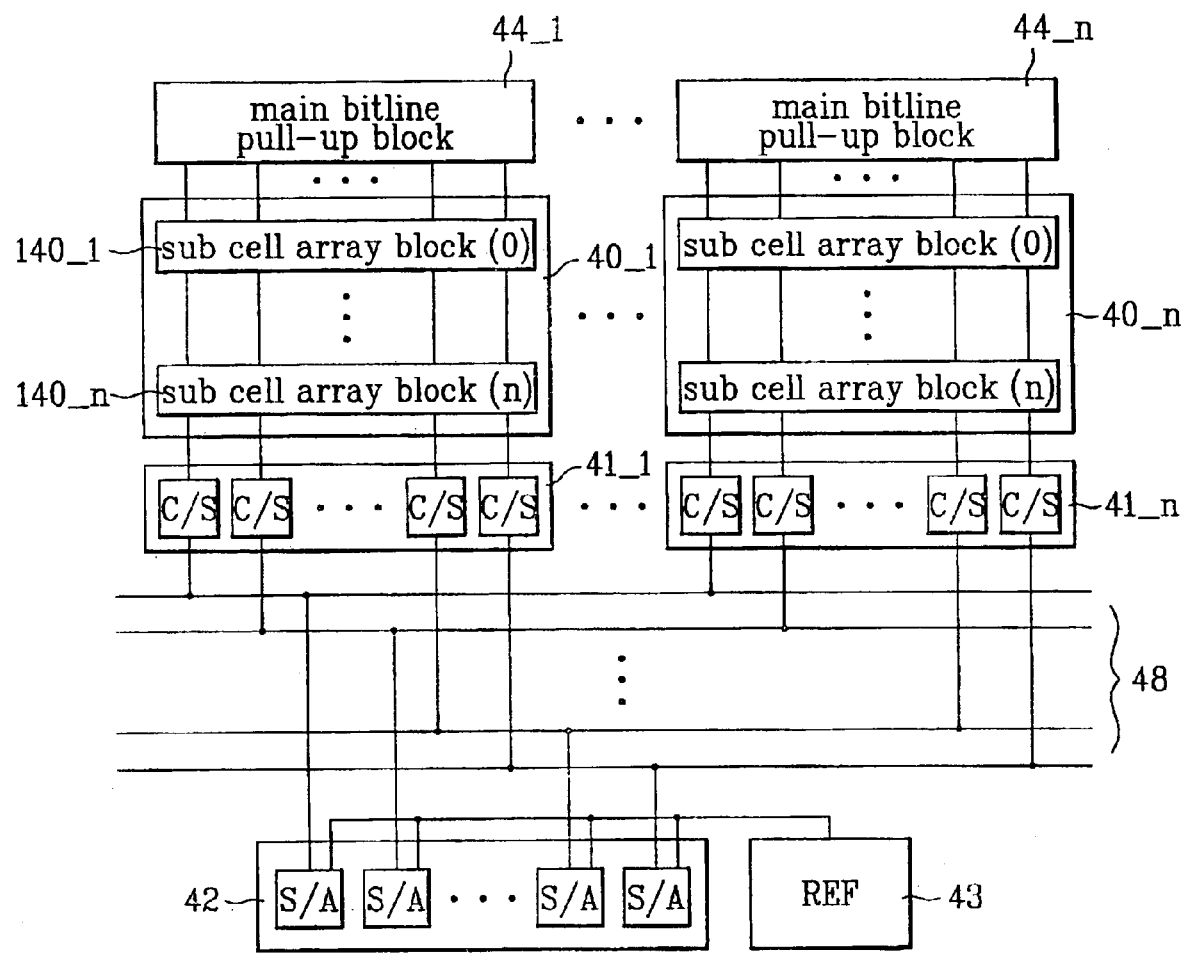
FIGS. 4A and 4B are two different examples of schematic views of a nonvolatile ferroelectric memory device according to an embodiment of the present invention.
Figure 4B:
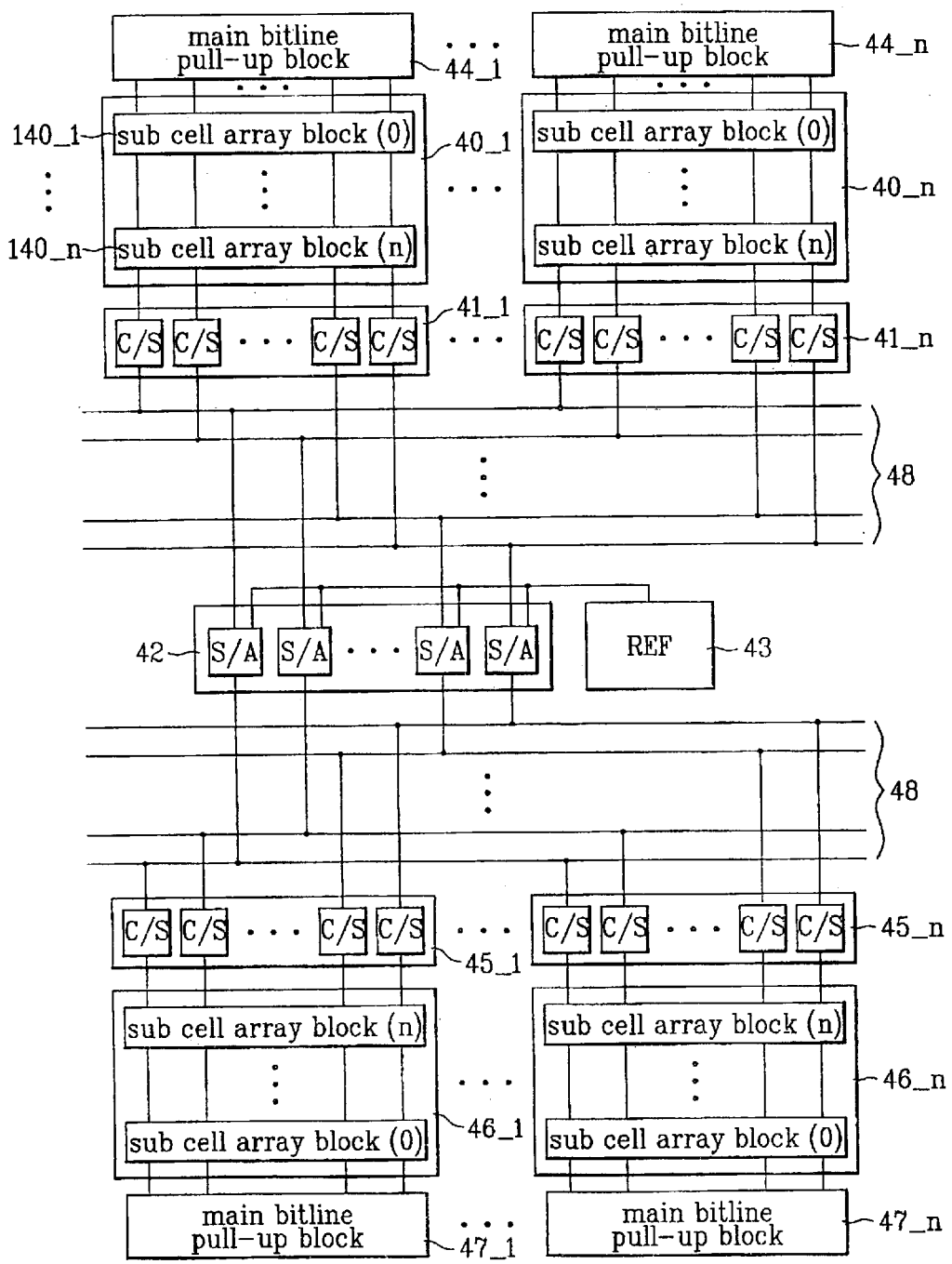

FIGS. 4A and 4B are different examples of schematic views of the nonvolatile ferroelectric memory device according to an embodiment of the present invention.

As shown in FIG. 4A, the nonvolatile ferroelectric memory device according to the present invention includes a plurality of cell array blocks 40_1~40_n, a plurality of column selector blocks 41_1~41_n corresponding to the respective cell array blocks, a sensing amplifier block 42 commonly used for all the cell array blocks and including a plurality of sensing amplifiers (S/As), a reference generator 43 commonly connected with the plurality of sensing amplifiers (S/As) in the sensing amplifier block 42, and a plurality of main bitline pull-up blocks 44_1~44_n adjacent the cell array blocks and each pulling up a main bitline of the corresponding cell array block. All these components are operatively coupled.

Each of the cell array blocks 40_1~40_n includes a plurality of sub cell array blocks 140 (140_1 . . . 140_n), and the plurality of main bitline load controllers (which are illustrated in the subsequent drawings). Each of the sub cell array blocks includes a plurality of main bitlines and sub bitlines corresponding to the main bitlines one to one.

Each main bitline of each cell array block is connected with a column selector C/S in the column selector block one to one. A plurality of output signals which passed through the column selector are connected with each sensing amplifier in the sensing amplifier block 42 through a common signal bus line and signal bus lines 48.

The number of the sensing amplifiers in the sensing amplifier block 42 is identical to the number of signal bus lines.

Referring to FIG. 4B, as another example, a plurality of cell array blocks of the aforementioned nonvolatile ferroelectric memory device are arranged at upper and lower portions of the sensing amplifier block 42 and the reference generator 43. That is, main bitline pull-up blocks 47_1~47_n and column selectors 45_1~45_n are arranged to correspond to cell array blocks 46_1~46_n in addition to the structure shown in FIG. 4A.

At this time, the signal bus lines 48 are arranged at the upper cell array blocks 40_1~40_n and the lower cell array blocks 46_1~46_n to correspond to the number of the sensing amplifiers in the sensing amplifier block 42.

The structure according to the aforementioned nonvolatile ferroelectric memory device will be described.

As mentioned above, in the present invention, the main bitline load controllers are respectively arranged in the respective cell array block having a plurality of sub cell array blocks.

Figure 5A:
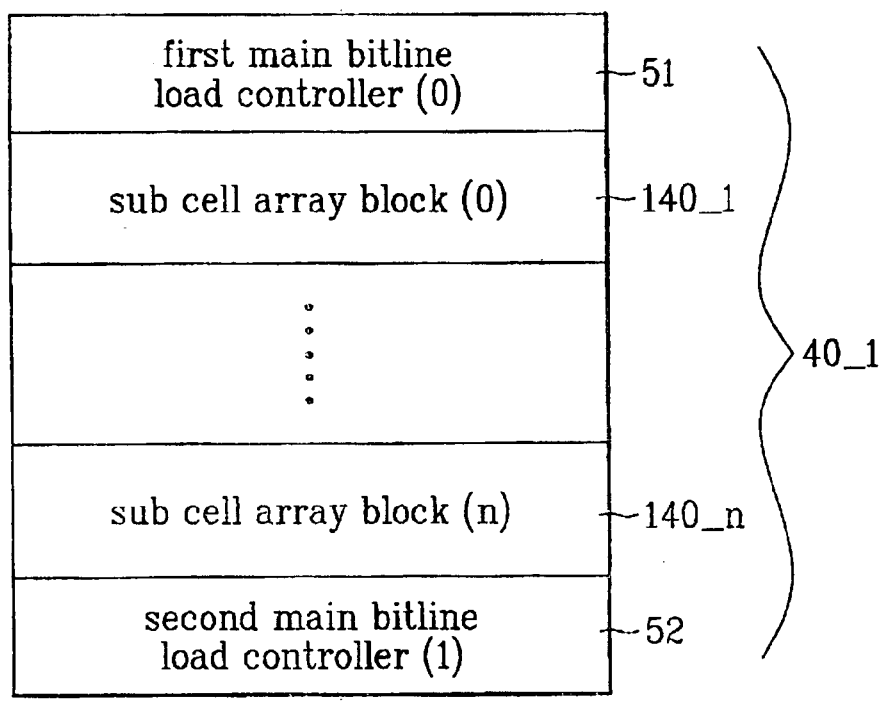
FIG. 5A is a schematic diagram of a cell array block according to a first embodiment of the present invention.
Figure 5B:
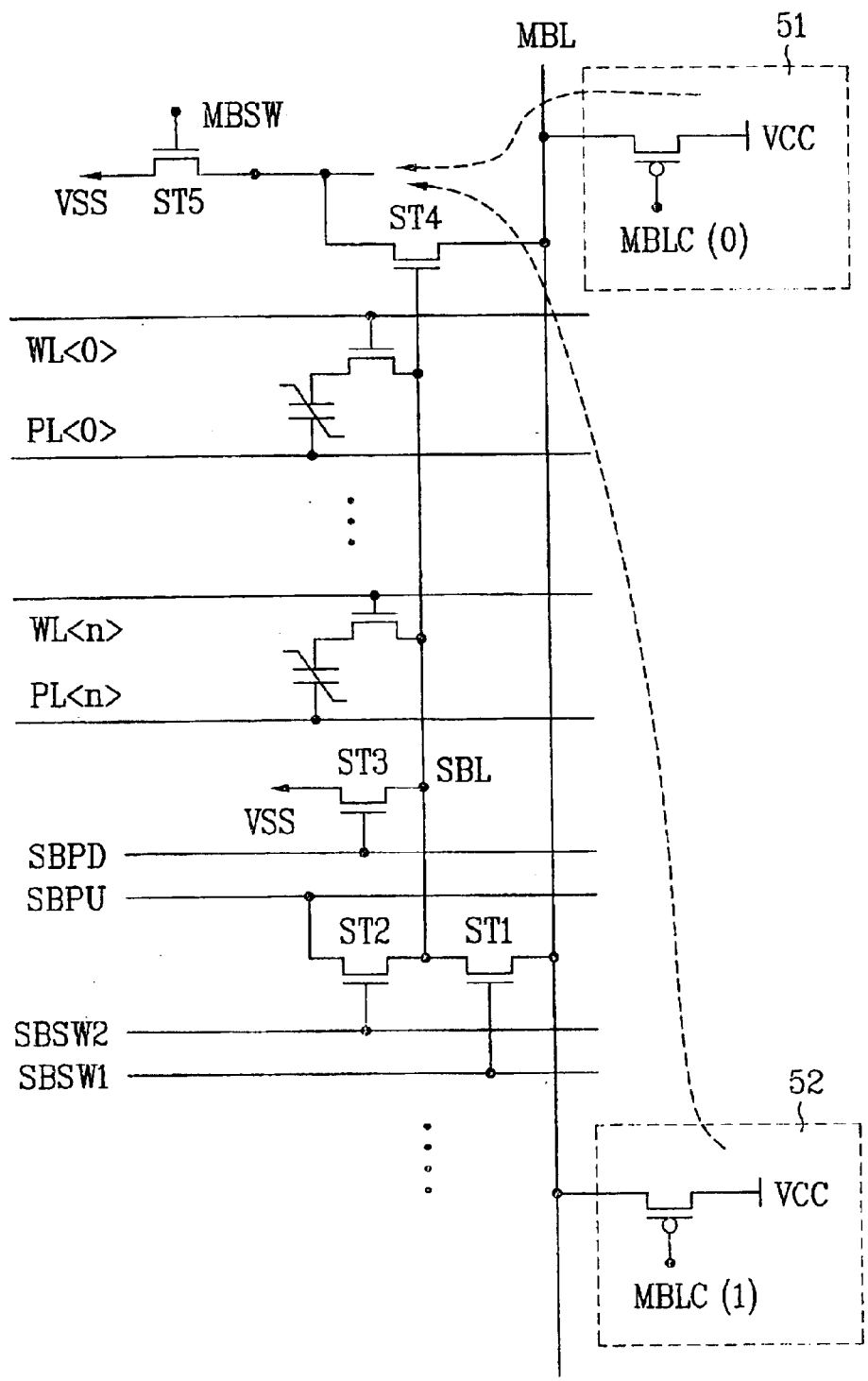
FIG. 5B is a circuit diagram of FIG. 5A according to the first embodiment of the present invention.

In the cell array block according to the first embodiment of the present invention, as shown in FIGS. 5A and 5B, the main bitline load controllers are respectively arranged at upper and lower portions of each cell array block.

As one example, a first main bitline load controller 51 is arranged at an upper portion adjacent to the first sub cell array block 140_1 of the cell array block 40_1, and a second main bitline load controller 52 is arranged at a lower portion adjacent to the last sub cell array block 140_n of the cell array block 40_1. This configuration is applied to each of the cell array blocks 40_1 . . . 40_n.

More specifically, as shown in FIG. 5B, each of the respective main bitline load controllers 51 and 52 of the cell array blocks 40_1 . . . 40_n includes a PMOS transistor according to the first embodiment of the present invention. A drain terminal of the PMOS transistor is connected with the main bitline MBL, its source terminal is connected with a power source terminal VCC or a VPP applying terminal, and its gate terminal is arranged so that the respective main bitline load control signals MBLC(0)~MBLC(n) are applied thereto.

The respective main bitline load controller serves to load the main bitline during a sensing operation, and the main bitline sensing voltage is determined by the main bitline load resistance and current level.

Figure 11:
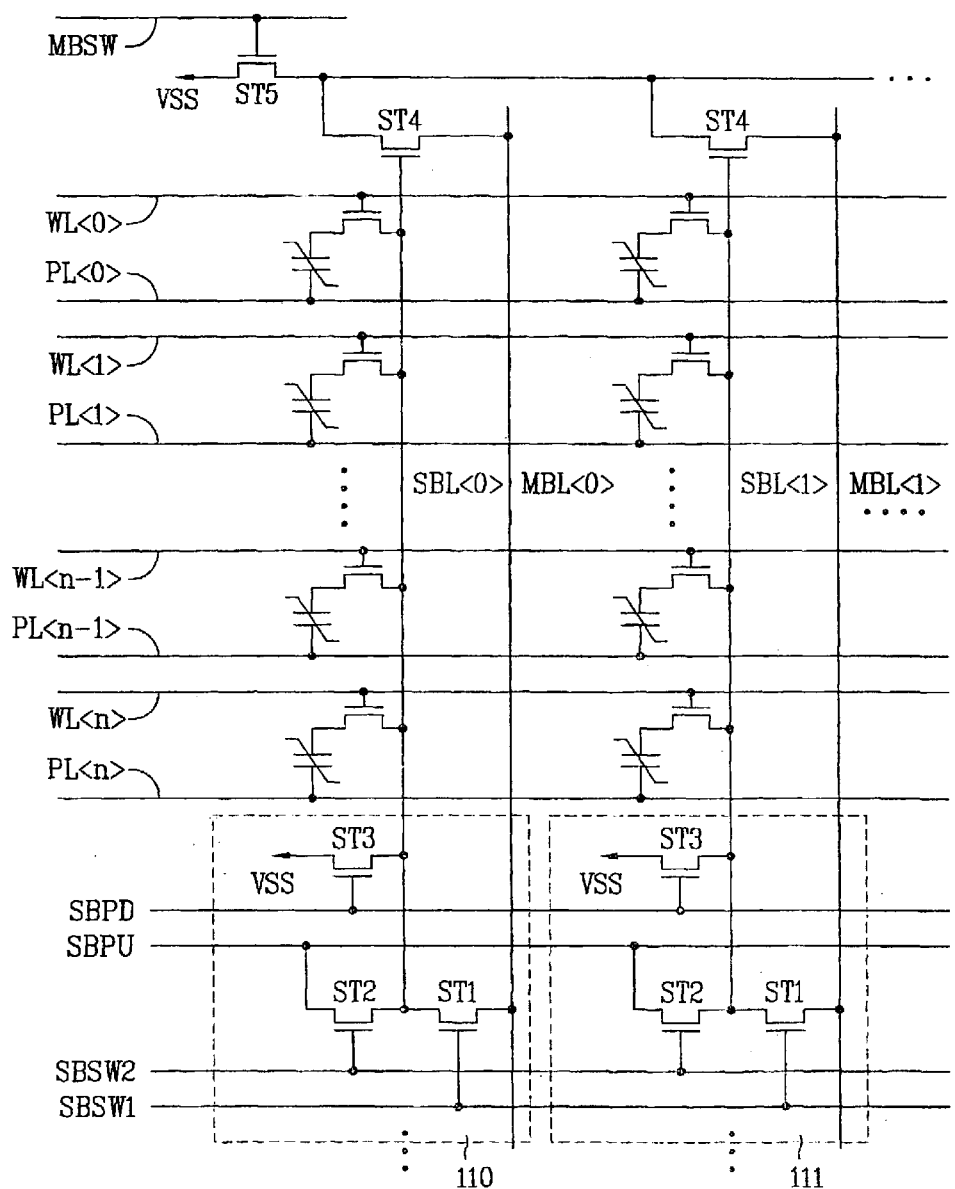
FIG. 11 is a circuit diagram for explaining a second method of a sub cell array block according to the first embodiment of the present invention.

As an example of the sub cell array block, a cell array having an open bitline structure of FIG. 11 is shown in FIG. 5B.

In the first embodiment of the present invention, current is concentrated on the source terminal of the fourth switching transistor ST4 through the first and second main bitline load controllers 51 and 52 respectively formed at upper and lower portions.

Figure 6A:
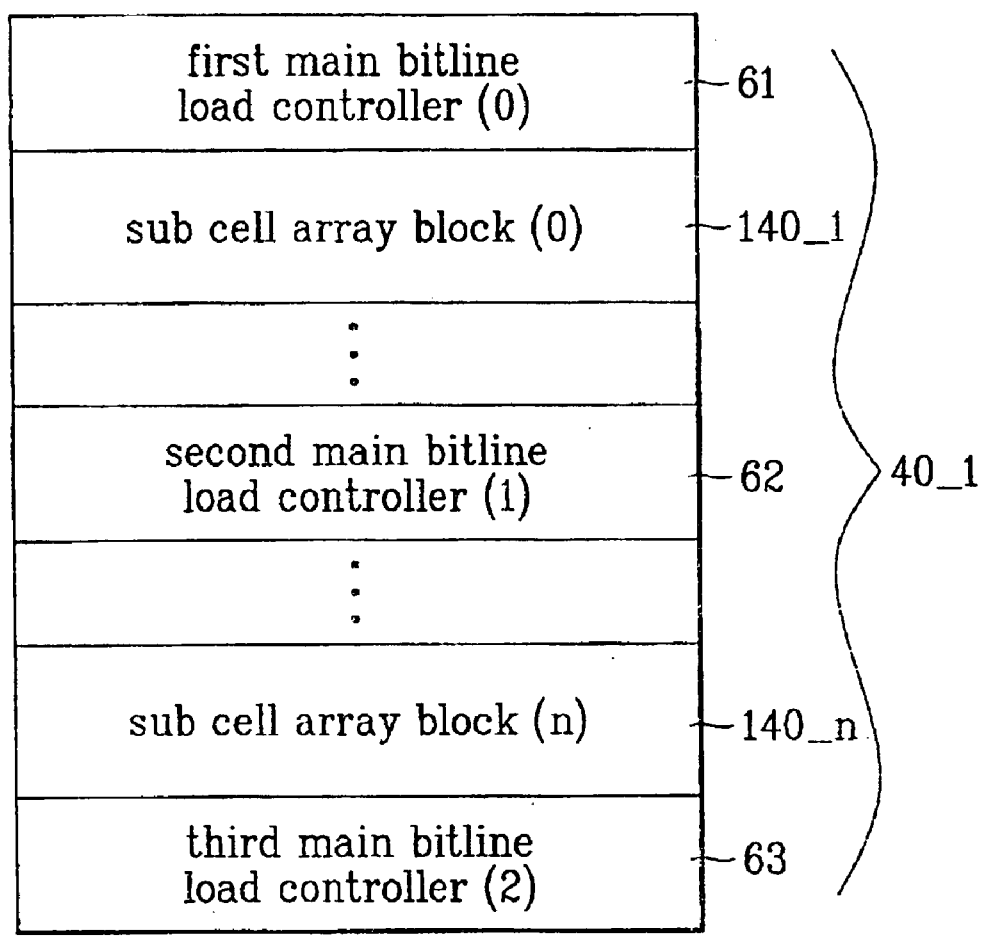
FIG. 6A is a schematic diagram of a cell array block according to a second embodiment of the present invention.
Figure 6B:
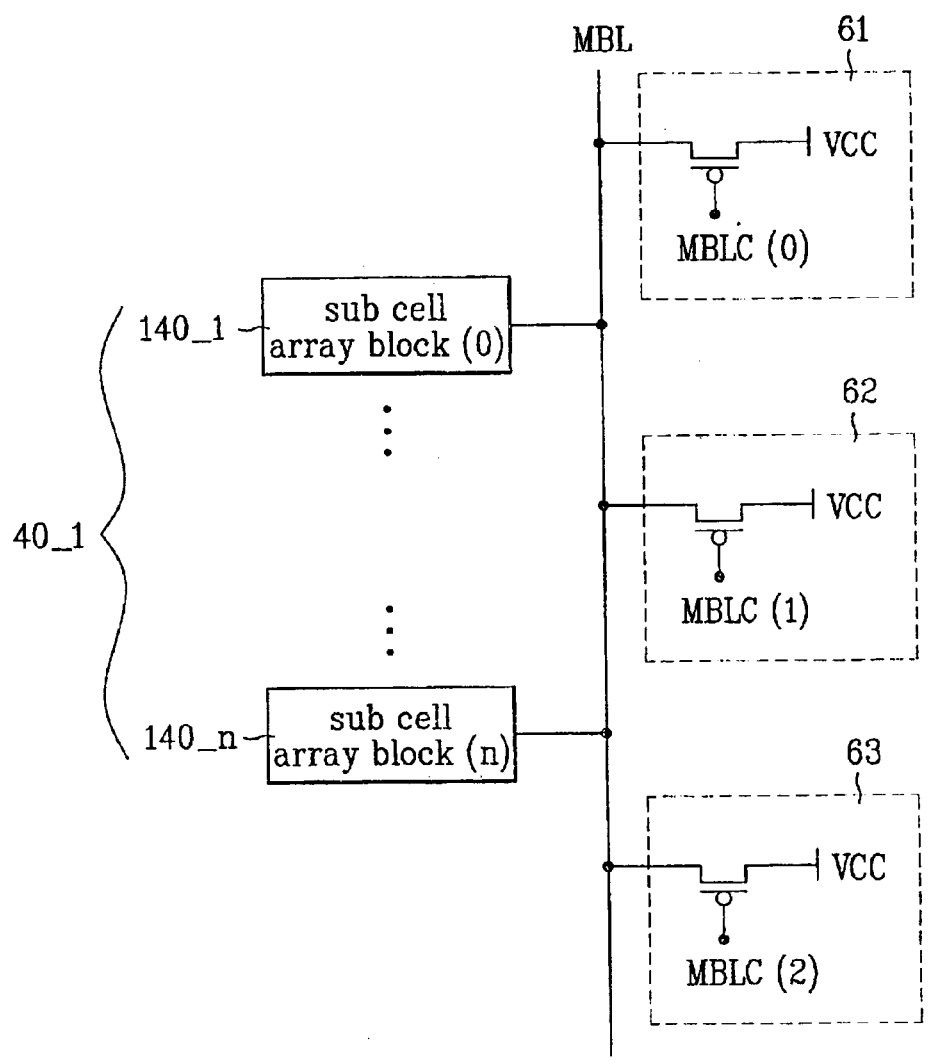
FIG. 6B is a circuit diagram of FIG. 6A according to the second embodiment of the present invention.

In the cell array block according to a second embodiment of the present invention, as shown in FIGS. 6A and 6B, three main bitline load controllers are provided at upper, lower and intermediate portions of each cell array block.

As one example, a first main bitline load controller 61 is arranged at the upper portion adjacent to the first sub cell array block 140_1 of the cell array block 40_1, a second main bitline load controller 62 is arranged at the intermediate portion of the cell array block 40_1, and a third main bitline load controller 63 is arranged at the lower portion adjacent to the last sub cell array block 140_n of the cell array block 40_1.

In one embodiment, (n+1)/2 number of sub cell array blocks are arranged each between the second main bitline load controller 62 and the third main bitline load controller 63 and between the first main bitline load controller 61 and the second main bitline load controller 62. The configuration and/or connection of each of the main bitline load controllers 61–63 is the same as those of the main bitline load controllers 51–52.

Figure 7A:
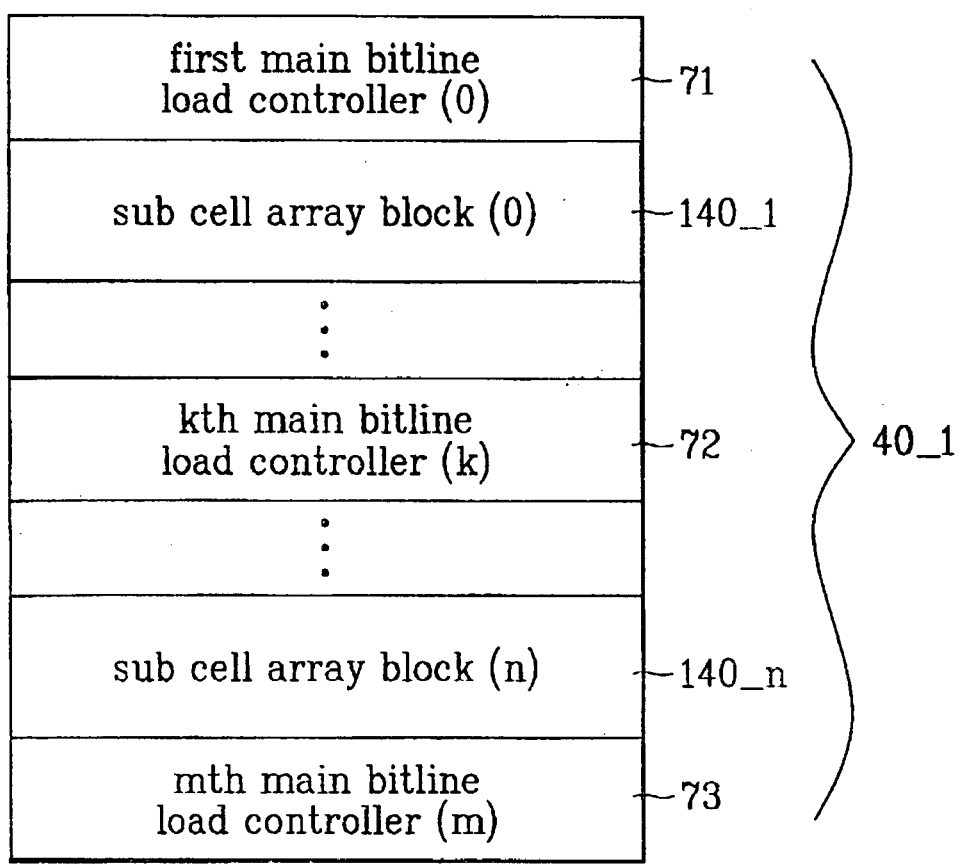
FIG. 7A is a schematic diagram of a cell array block according to a third embodiment of the present invention.
Figure 7B:
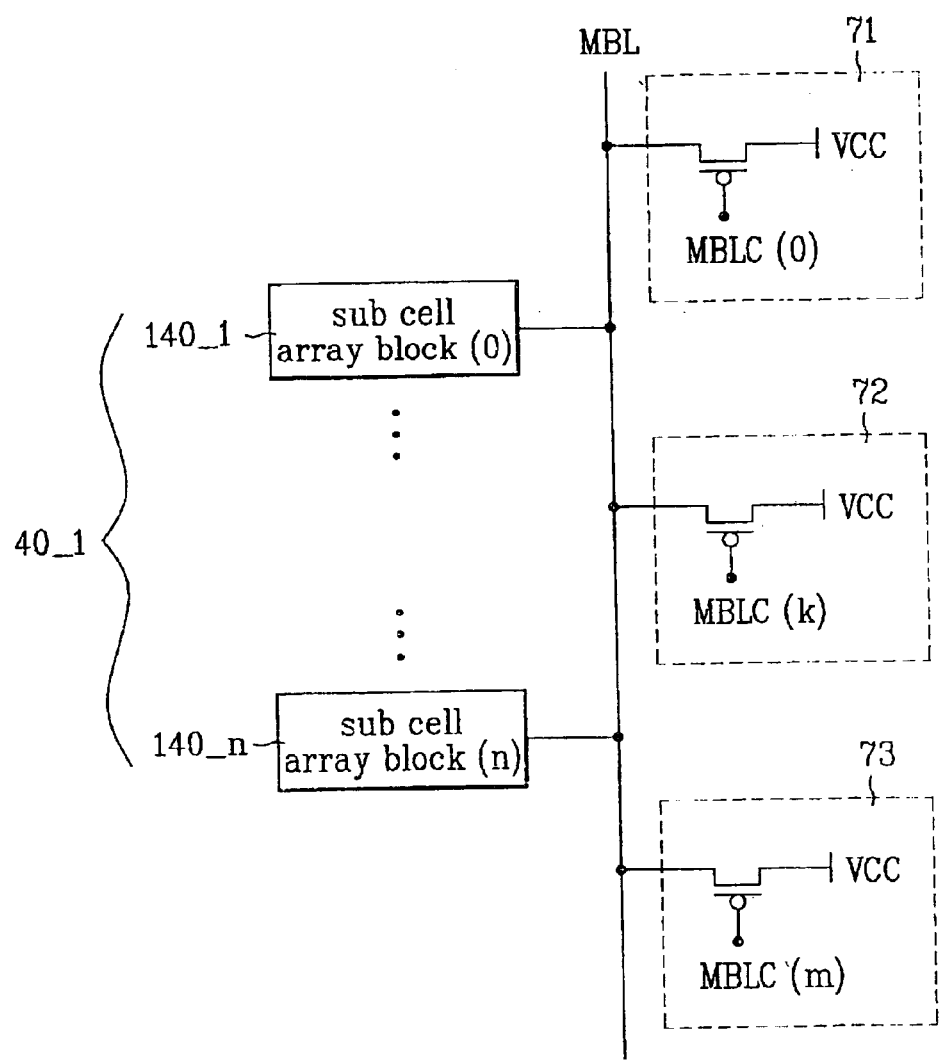
FIG. 7B is a circuit diagram of FIG. 7A according to the third embodiment of the present invention.

In the cell array block according to a third embodiment of the present invention, as shown in FIGS. 7A and 7B, a plurality of main bitline load controllers are arranged between a plurality of sub cell array blocks of each cell array block. That is, two or more main bitline load controllers are distributed between the first and last sub cell array blocks of each cell array block.

In one example, a first main bitline load controller 71 is arranged at the upper portion adjacent to the first sub cell array block 140_1 of the cell array block 40_1, a kth main bitline load controller 72 is arranged at an intermediate or some portion of the cell array block 40_1, and an mth main bitline load controller 73 is arranged at the lower portion adjacent to the last sub cell array block 140_n of the cell array block 40_1.

In this example, two or more sub cell array blocks are arranged between the respective main bitline load controllers, but other numbers are possible. In this case, m is smaller than n.

Each of the main bitline load controllers according to the embodiments of the invention includes a PMOS transistor. However, a different number of the PMOS transistors and/or different types of transistors or switching elements may be used instead.

Once the main bitline load controllers are arranged as discussed above, the same sensing margin can be obtained anywhere without reducing the main bitline sensing voltage due to the main bitline resistance component.

Figure 8:
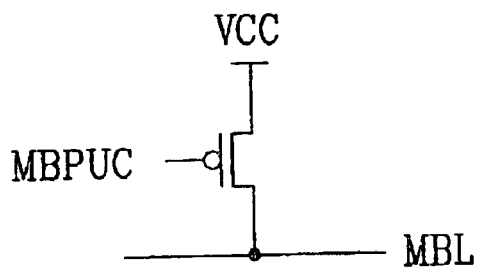
FIG. 8 is a circuit diagram of a main bitline pull-up control block according to an embodiment of the present invention.

FIG. 8 shows an example of the main bitline pull-up block usable in the present invention. As shown in FIG. 8, according to an embodiment, each of the main bitline pull-up blocks 44_1~44_n shown in FIGS. 4A and 4B includes a PMOS transistor. The drain terminal of the PMOS transistor is connected with the main bitline MBL, its source terminal is connected with the power source terminal, and its gate terminal is arranged so that a main bitline pull-up control signal MBPUC is applied thereto. At this time, VCC or VPP is supplied to the source terminal of the main bitline pull-up block. The main bitline pull-up block serves to pull up the corresponding main bitline during a precharge operation.

Figure 9:
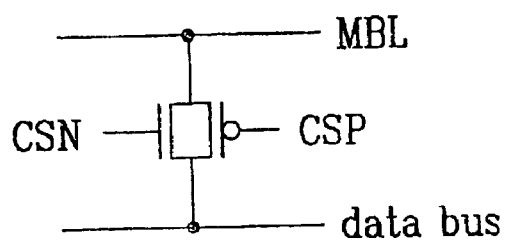
FIG. 9 is a circuit diagram of a column selector according to an embodiment of the present invention.

FIG. 9 shows an example of a column selector C/S usable in the present invention. As shown in FIG. 9, each of the column selectors C/S shown in FIGS. 4A and 4B includes according to an embodiment of the invention a transfer gate having an NMOS transistor and a PMOS transistor, whose drain terminal is connected with the main bitline and whose source terminal is connected with the data bus. The respective column selectors C/S shown in FIGS. 4A and 4B serve to prevent voltage drop between the corresponding main bitline and the data line.

The corresponding main bitline MBL is selected by the column selector C/S and is pulled up by the main bitline pull-up block when it is not driven.

The sub cell array block of the present invention will be described with reference to FIGS. 10 and 11.

Figure 10:
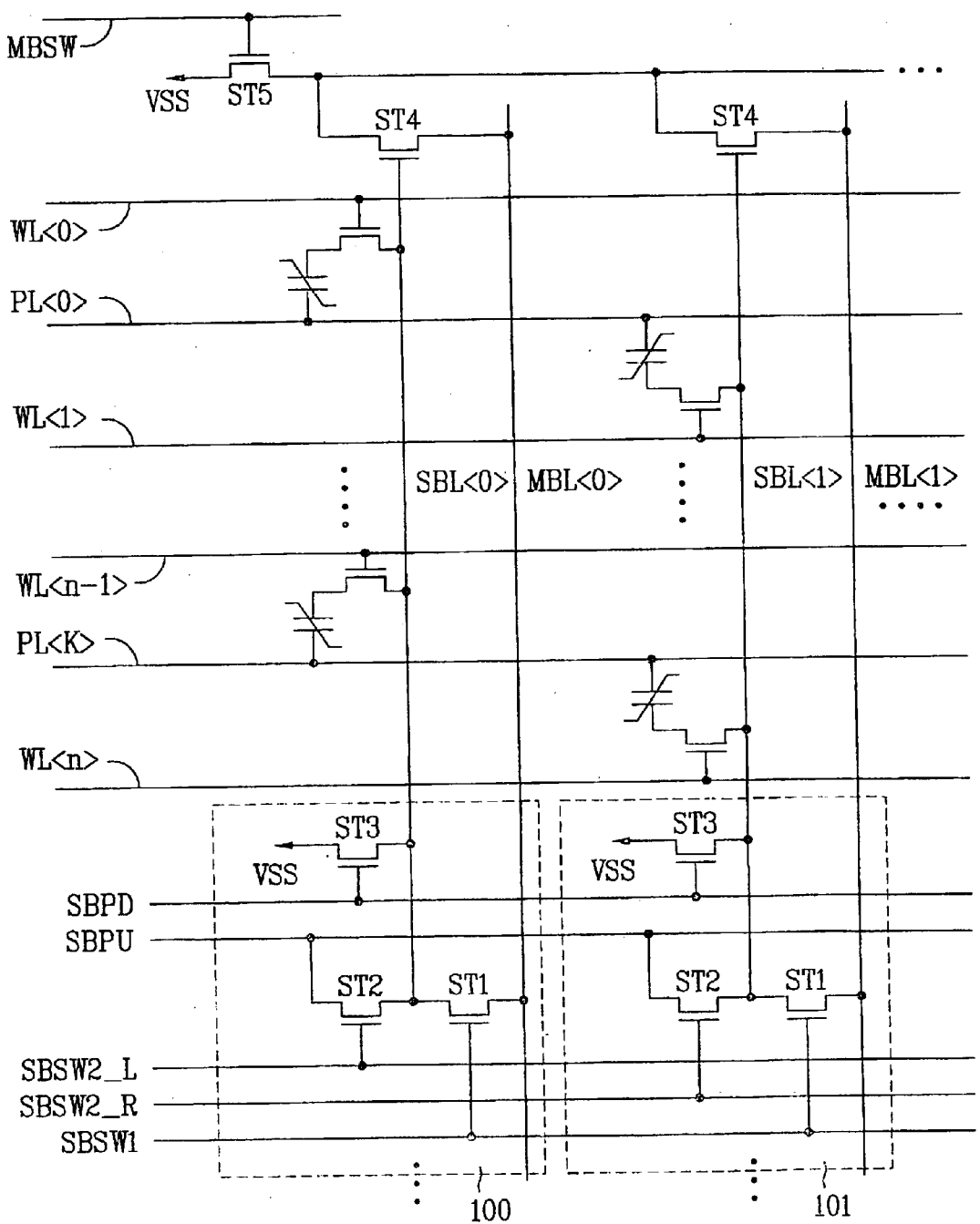
FIG. 10 is a circuit diagram for explaining a first method of a sub cell array block according to the first embodiment of the present invention.

FIG. 10 is a circuit diagram according to a first method of the sub cell array block according to the first embodiment of the present invention, and FIG. 11 is a circuit diagram according to a second method of the sub cell array block according to the first embodiment of the present invention.

First, the circuit diagram according to the first method of the sub cell array block will be described. The cell data are sensed by an electric current amount. The sub cell array block has a folded bit line structure. A plate line is commonly used between two wordlines.

In more detail, referring to FIG. 10, the sub cell array block includes n+1 rows and n+1 columns where they define a plurality of cells in a plurality of row directions and a plurality of column directions.

A unit cell per two columns is arranged in each row direction, and a unit cell per two rows is arranged in each column direction.

Therefore, once one wordline and one plate line are activated, the cell connected with the odd numbered bitline or the even numbered bitline is only selected. The other odd or even numbered bitlines are used as reference lines.

In more detail, a plurality of main bitlines MBL<0>, MBL<1> . . . MBL<n> are arranged in one direction, and sub bit lines SBL<0>, SBL<1> . . . SBL<n> are arranged in the same direction as the main bitlines MBL<0>, MBL<1> . . . MBL<n> to connect with the unit cell in each sub cell array block. A plurality of wordlines WL<0> . . . WL<n> and a plurality of plate lines PL<0> . . . PL<K> are arranged to be perpendicular to the main bitlines MBL<0> . . . MBL<n>.

At this time, one plate line is arranged per two wordlines. That is, the unit cells in a column direction are connected with one plate line.

A sub bitline pull-down (SBPD) line, a first sub bitline switching signal SBSW1 line, second left and right sub bitline switching signal SBSW2_L and SBSW2_R lines, and a sub bitline pull-up SBPU line are arranged in the same direction as the wordlines and the plate lines.

Each of switching control blocks 100, 102, . . . are arranged to correspond to one main bitline and one sub bitline under the control of the SBPD line, the SBSW1 line, the SBSW2_L line, the SBSW2_R line, and the SBPU line. The switching control blocks 100, 102, . . . control whether the selected cell will be connected with the main bitline or the sub bitline, and control a voltage applied to a ferroelectric capacitor of the selected cell.

Each of the switching control blocks 100, 101 . . . includes first, second, and third switching transistors ST1, ST2, and ST3, which are in this example, NMOS transistors, but may be other types of transistors. The first switching transistor ST1 has a gate connected with the SBSW1 line, one electrode connected with the corresponding main bitline MBL, and the other electrode connected with the corresponding sub bitline SBL.

The second switching transistor ST2 has a gate connected with the SBSW2_L line or the SBSW2_R line, one electrode connected with the corresponding sub bitline SBL, and the other electrode connected with the SBPU line.

The third switching transistor ST3 has a gate connected with the SBPD line, one electrode connected with the corresponding sub bitline SBL, and the other electrode connected with a ground voltage terminal VSS.

A fourth transistor ST4 which is, e.g., an NMOS transistor has a gate connected with the corresponding sub bitline SBL, a drain and a source respectively connected between the corresponding main bitline MBL and the ground VSS terminal. The fourth transistor ST4 is arranged per sub bitline.

A voltage corresponding to the data stored in the cell is applied to the sub bitline of each sub cell array block. The voltage is applied to the gate electrode of the fourth switching transistor ST4 through the sub bitline.

The electric current value in the fourth switching transistor ST4 depends on the size of the voltage corresponding to the data stored in the cell. The data of the cell can be sensed by comparing the voltage of the main bitline connected with the drain terminal of the fourth switching transistor ST4 with the reference value.

Among the plurality of sub bitlines SBL<0> . . . SBL<n>, one sub bitline SBL is selected by activating one of the SBSW1 signals. Thus, load in the bitline can be reduced. Also, the selected sub bitline SBL is adjusted to the ground voltage level if the SBPD signal is activated by the SBPD line. The SBPU is to adjust the power which will be supplied to the SBL. A higher voltage than the VCC voltage is generated at a low voltage operation. The SBSW2_L and the SBW2_R serve to switch signal flow between the SBPU and the SBL. The plurality of cells are connected with the respective SBL.

Meanwhile, a fifth switching transistor ST5 which is, in this example, an NMOS transistor is provided to prevent electric current leakage during a data writing operation.

The fifth switching transistor ST5 has a gate terminal connected with the main bitline switching signal MBSW, a drain terminal commonly connected with the respective source terminals of the fourth switching transistors ST4s, and a source terminal connected with the ground voltage terminal VSS. The fifth switching transistor ST5 is arranged per sub cell array block.

The circuit diagram according to the second method of the sub cell array block will now be described.

As shown in FIG. 11, a pair of wordline and plate lines are arranged and cells are respectively arranged in the wordline and plate line pairs and the sub bit line. The gate of the second switching transistor ST2 of each switching control block 110, 111 . . . is operated under the control of the second sub bitline switching signal SBSW2 line. The circuit according to the second method of the sub cell array block has a hierarchical open bitline cell structure in which unit cells are overlapped with one another when the sub cell array block is folded around the bitline.

Next, a method for operating the main bitline load controller of the nonvolatile ferroelectric memory device according to an embodiment of the present invention will be described. The method for operating the main bitline load controller will be described with reference to a path type of driving current.

The path of the driving current is formed by two methods. The first method is that one of the main bitline load controllers nearest to the driving cell area is turned on. The second method is that two lower and upper main bitline load controllers adjacent to the driving cell area are turned on.

Figure 12A:
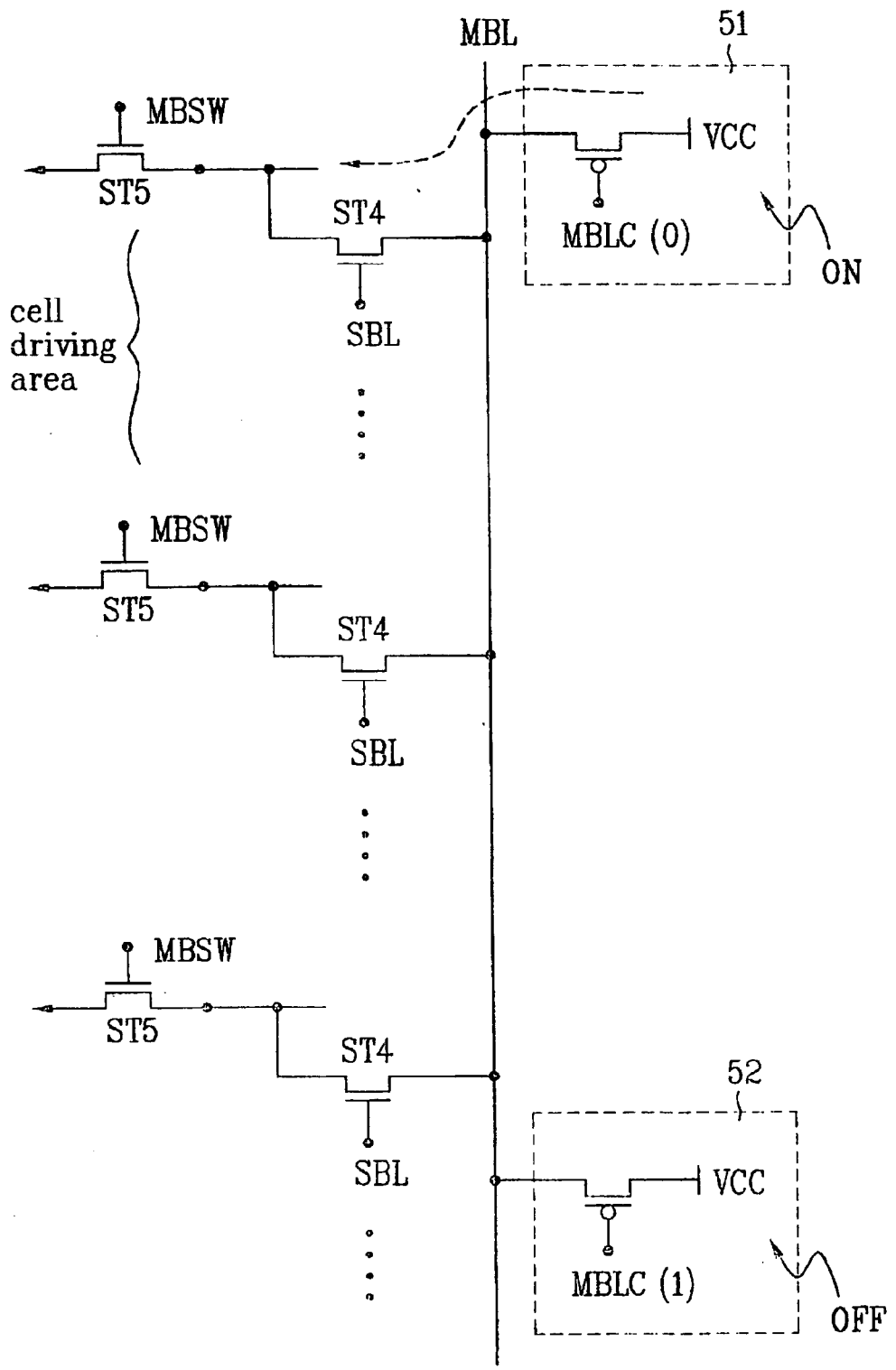
FIG. 12A is an exemplary view for forming driving current according to a first driving method of a main bitline load controller in a structure according to the first embodiment of the present invention.
Figure 12B:
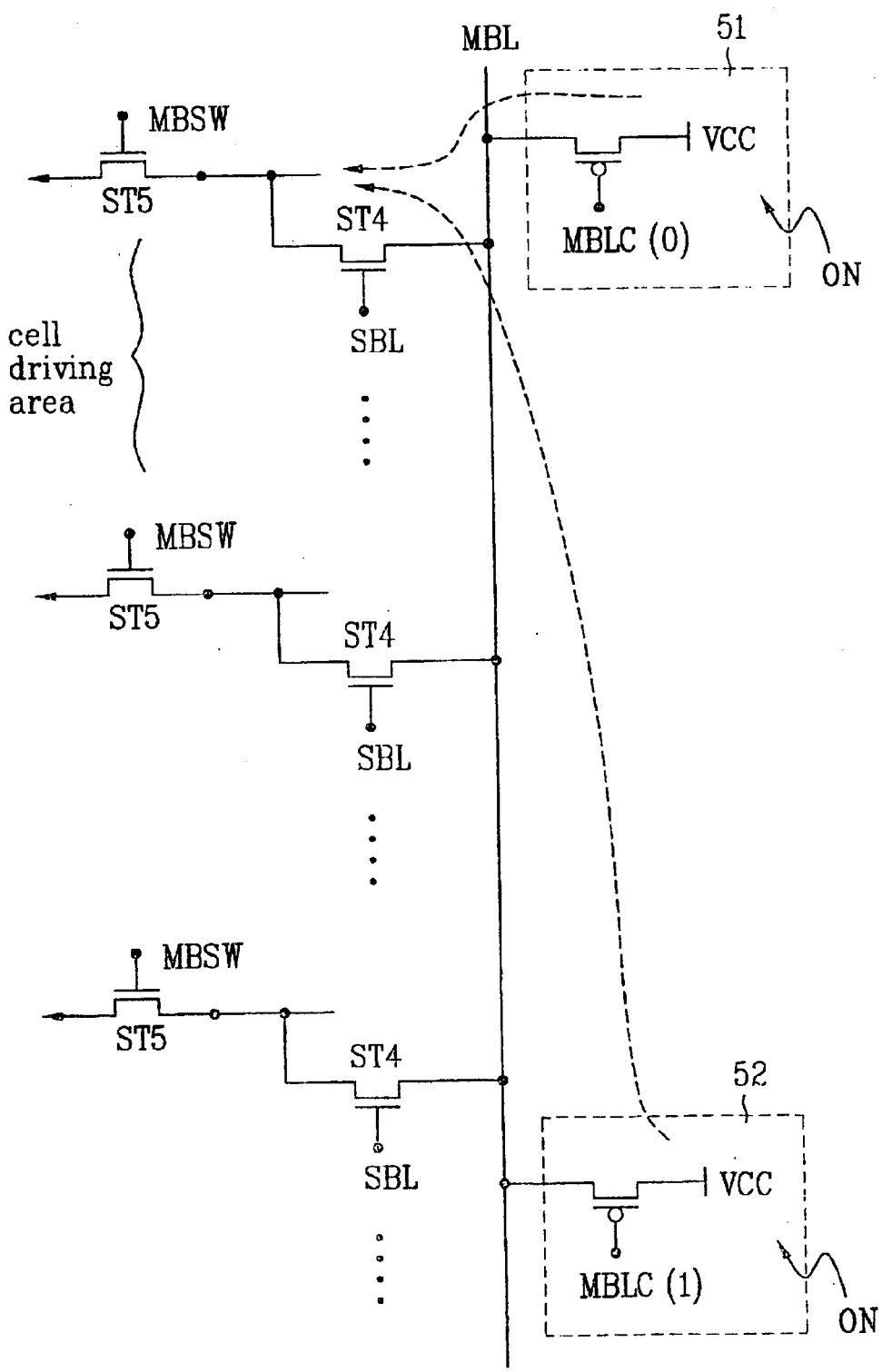
FIGS. 12B, 12C, and 12D are exemplary views illustrating formation of driving current according to a second driving method of the main bitline load controller in the structure according to the first embodiment of the present invention.
Figure 12C:
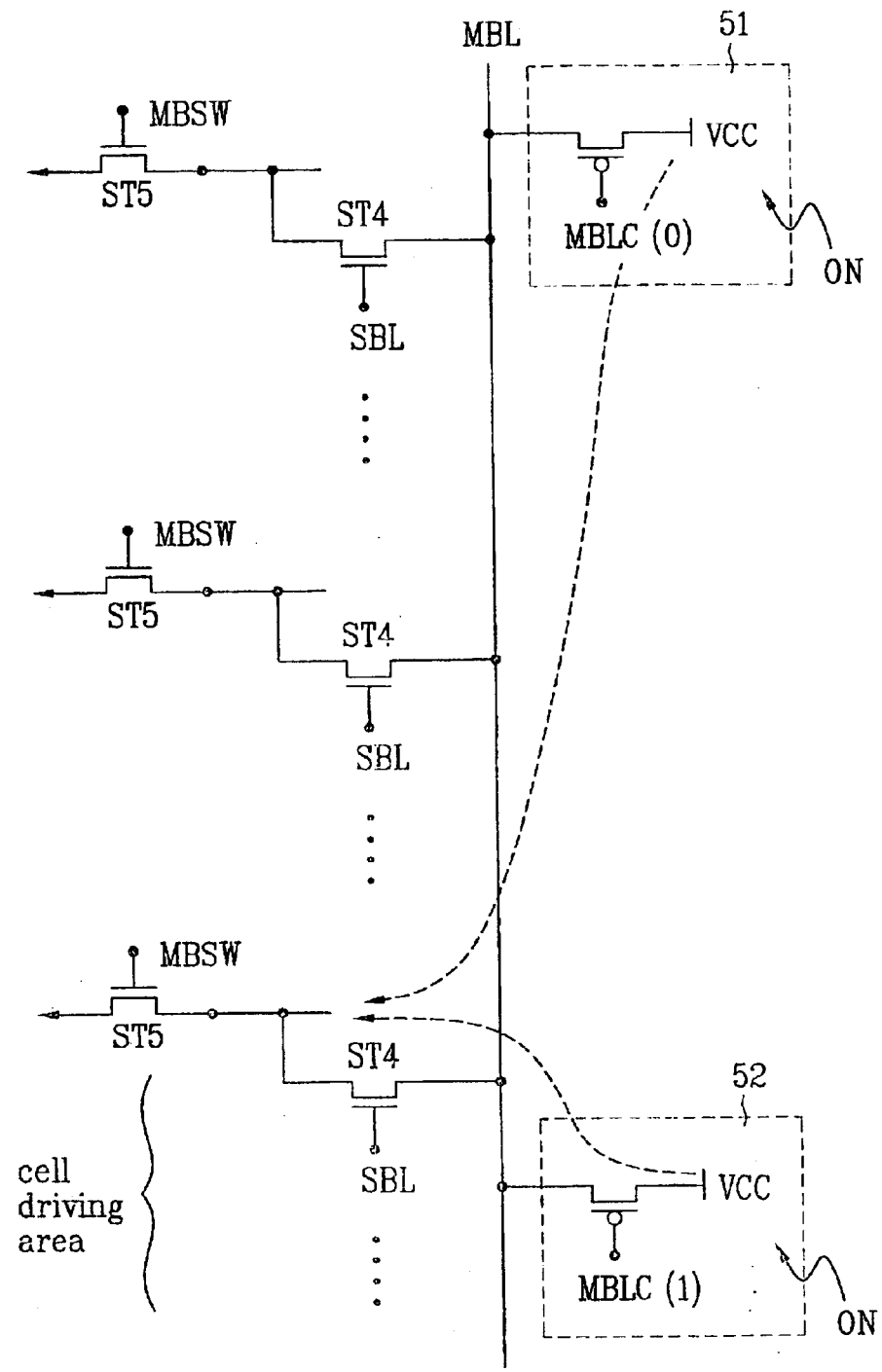
Figure 12D:
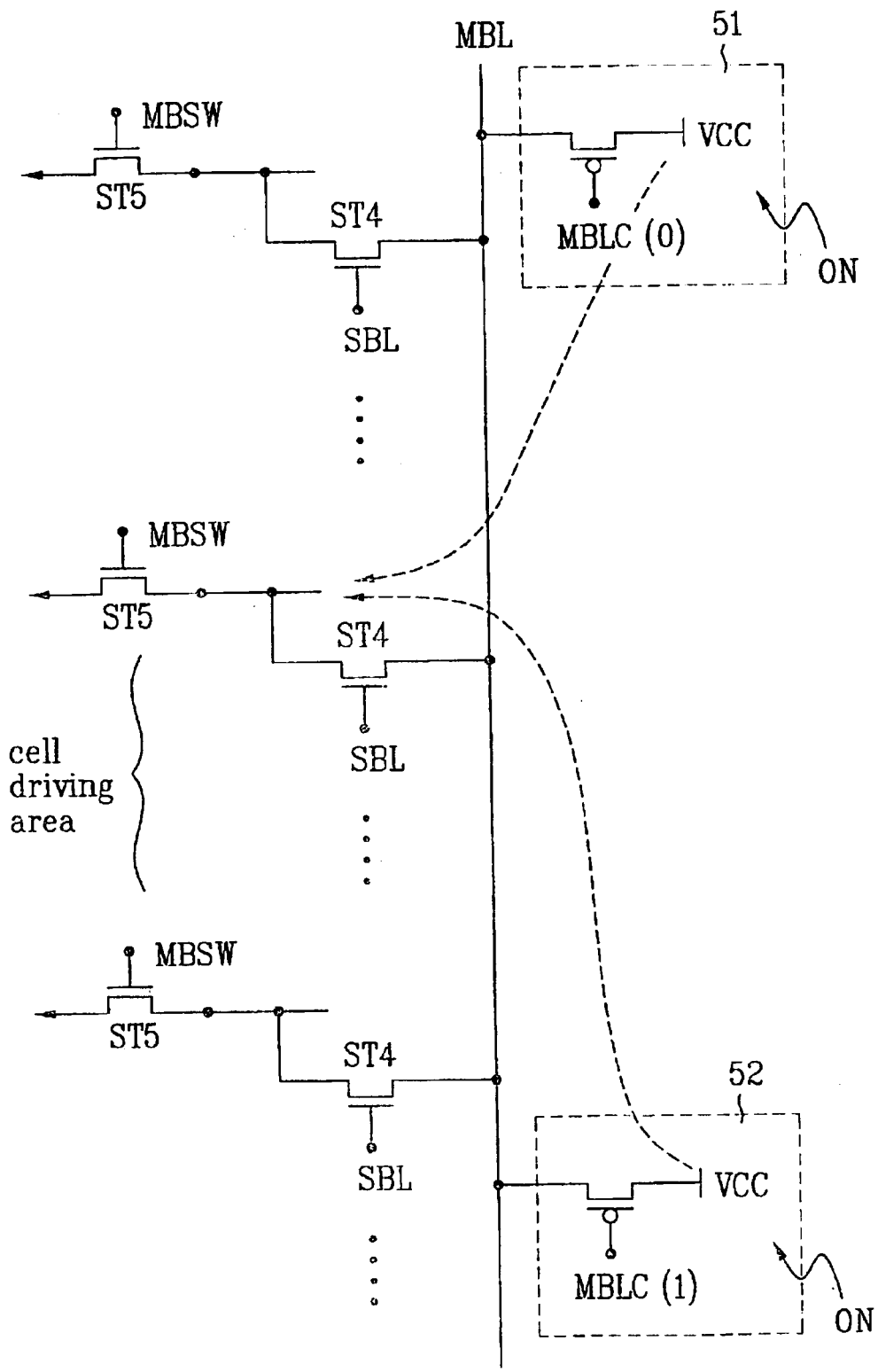

FIG. 12A is an exemplary view illustrating formation of the driving current according to a first driving method of the main bitline load controller in the structure according to the first embodiment of the present invention. FIGS. 12B, 12C, and 12D are exemplary views illustrating formation of the driving current according to a second driving method of the main bitline load controller in the structure according to the first embodiment of the present invention. Here, the cell array block configuration shown in FIGS. 12A–12D is the same as the cell array block configuration of FIGS. 5A and 5B.

Figure 13A:
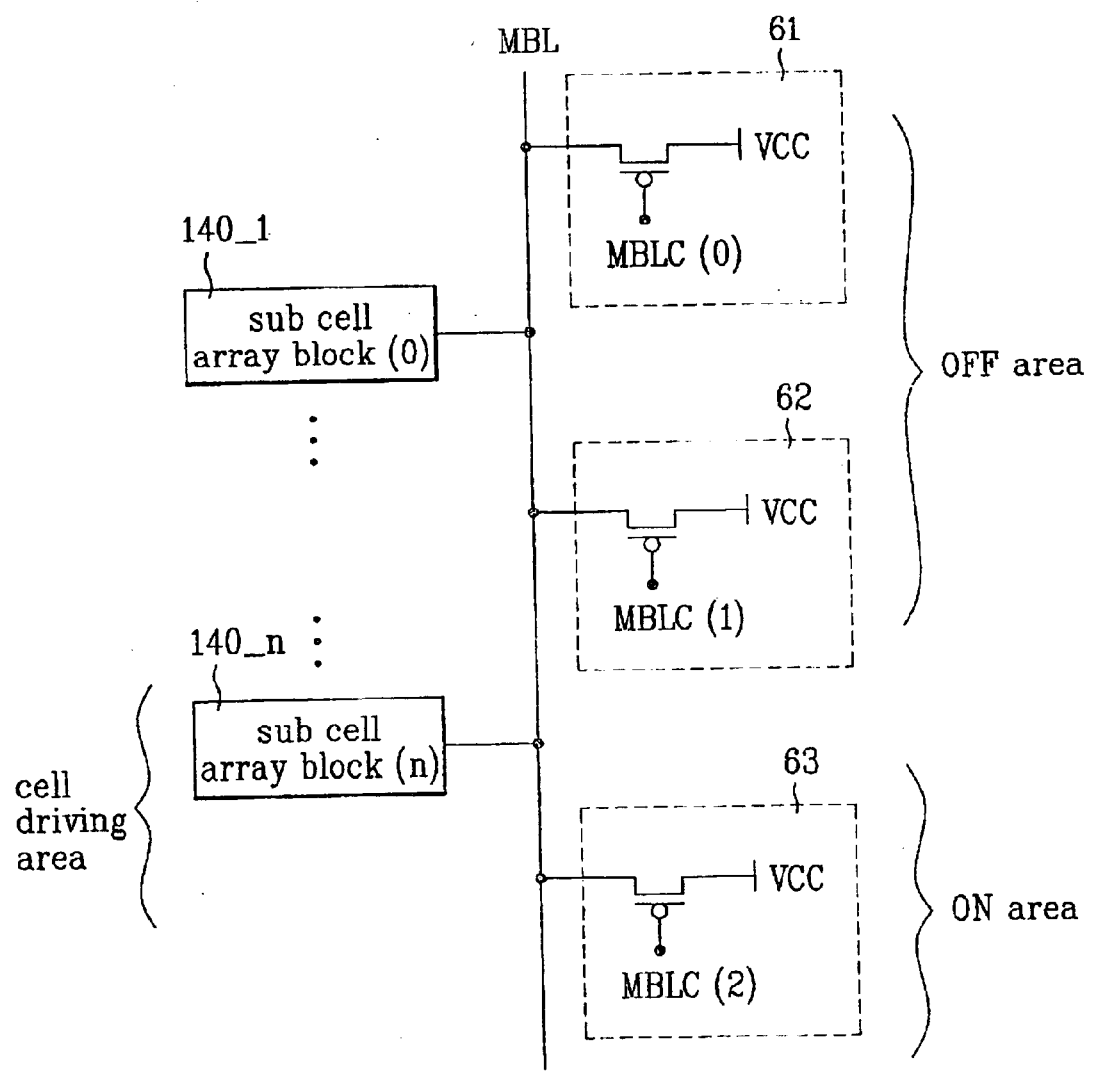
FIG. 13A is an exemplary view illustrating formation of driving current according to the first driving method of the main bitline load controller in the structure according to the second embodiment of the present invention.
Figure 13B:
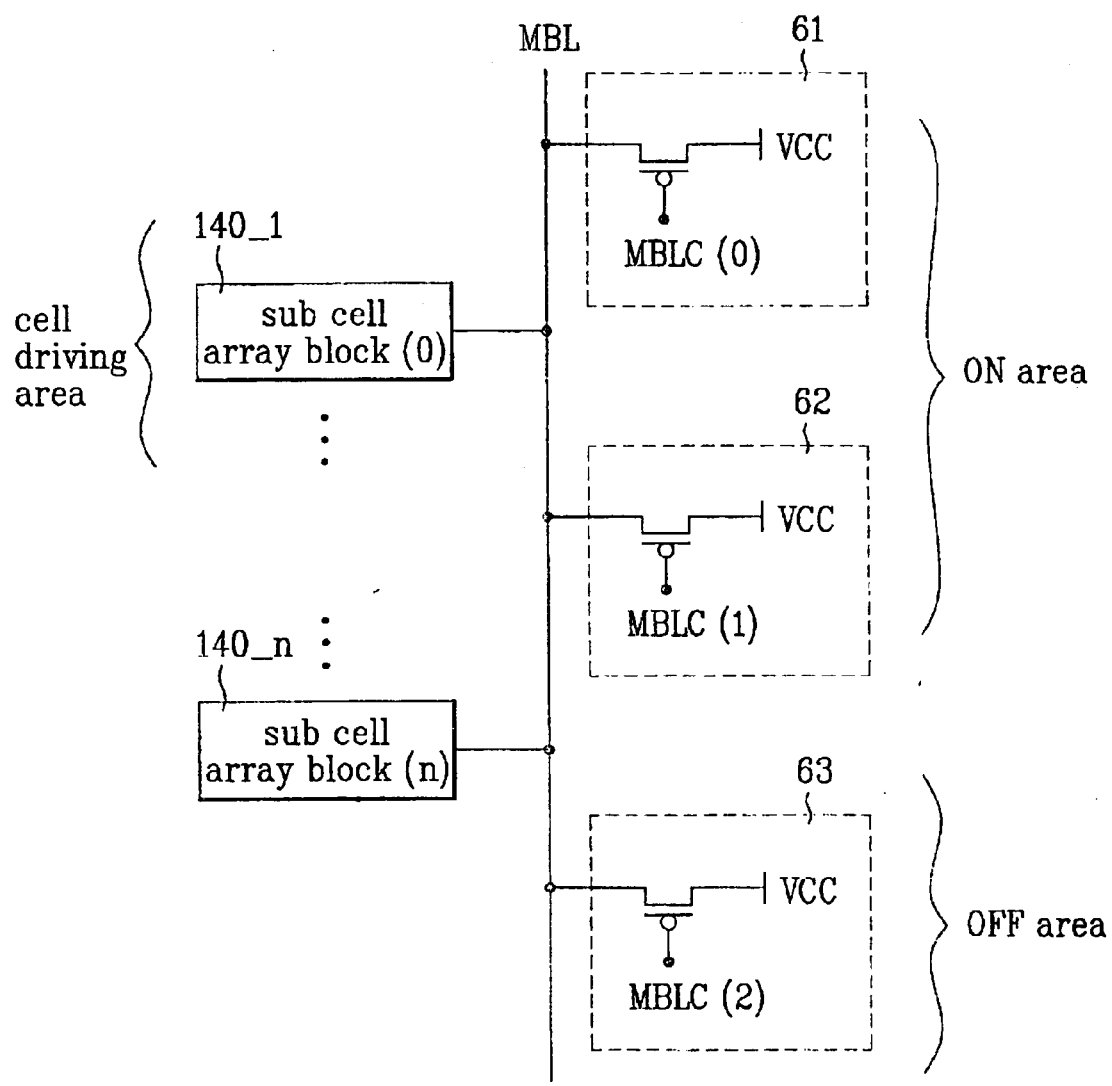
FIG. 13B is an exemplary view illustrating formation of driving current according to the second driving method of the main bitline load controller in the structure according to the second embodiment of the present invention.

FIG. 13A is an exemplary view illustrating formation of the driving current according to a first driving method of the main bitline load controller in the structure according to the second embodiment of the present invention. FIG. 13B is an exemplary view illustrating formation of the driving current according to a second driving method of the main bitline load controller in the structure according to the second embodiment of the present invention. Here, the cell array block configuration shown in FIGS. 13A and 13B is the same as the cell array block configuration of FIGS. 6A and 6B.

The path of the driving current according to the first method in the structure according to the first embodiment of the present invention, as shown in FIG. 12A, is formed by turning on only the first main bitline load controller 51 nearest to the uppermost cell area connected with the main bitline if the uppermost cell area is driven. At this time, an electric current path is formed in the drain direction of the fourth switching transistor ST4 of the uppermost cell area through the first main bitline load controller 51.

In other words, the cell area is divided into two lower and upper areas. If the upper cell area is driven, the first main bitline load controller 51 is turned on. If the lower cell area is driven, the second main bitline load controller 52 is turned on.

In the structure according to the first embodiment of the present invention, the path of the driving current according to the second method, as shown in FIGS. 12B, 12C, and 12D, is formed by turning on the first and second main bitline load controllers 51 and 52.

At this time, the first and second main bitline load controllers 51 and 52 are turned on regardless of the cell driving area. The average value of the electric current is equally obtained even though the respectively different current paths are formed.

In more detail, referring to FIG. 12B, when the uppermost cell area is driven, the electric current path is formed in the drain direction of the fourth switching transistor ST4 of the uppermost cell area in the first and second main bitline load controllers 51 and 52. At this time, the current which flows through the first main bitline load controller 51 is greater than the current which flows through the second main bitline load controller 52.

Referring to FIG. 12C, when the lowest cell area is driven, the electric current path is formed in the drain direction of the fourth switching transistor ST4 of the lowest cell area in the first and second main bitline load controllers 51 and 52. At this time, the current which flows through the first main bitline load controller 51 is smaller than the current which flows through the second main bitline load controller 52.

Referring to FIG. 12D, when the intermediate cell area between the uppermost cell area and the lowest cell area is driven, the electric current path is formed in the drain direction of the fourth switching transistor ST4 of the intermediate cell area in the first and second main bitline load controllers 51 and 52. At this time, the current which flows through the first main bitline load controller 51 is equal to the current which flows through the second main bitline load controller 52. That is, the first and second main bitline load controllers 51 and 52 are all driven even though the cell other than the uppermost cell area and the lowest cell area is driven.

As described above, since the first and second main bitline load controllers 51 and 52 are all driven, the current uniformly flows in the respective cell area. Therefore, the similar main bitline sensing voltage margin can be maintained in all the respective cell driving areas.

The path of the driving current according to the first method in the structure according to the second embodiment of the present invention is formed by turning on one main bitline load controller nearest to the driving cell area and turning off the other main bitline load controllers, as shown in FIG. 13A.

Referring to FIG. 13A, in this example when a cell in the lowest sub cell array block 140_n is driven, the third main bitline load controller 63 is turned on. In this case, the current path is formed along the lowest sub cell array block in the first main bitline load controller 63.

More generally, although not shown, in the structure according to the second embodiment of the present invention, the sub cell array area is divided into three portions. If a cell in the upper sub cell array area corresponding to the top ⅓ portion is driven, only the first main bitline load controller 61 is driven while the other main bitline load controllers 62 and 63 are turned off. If a cell in the intermediate sub cell array area corresponding to the ⅓~⅔ portion is driven, only the second main bitline load controller 62 is driven while the other main bitline load controllers 61 and 63 are turned off. If a cell in the lower sub cell array area corresponding to the bottom ⅓ portion is driven, only the third main bitline load controller 63 is driven while the other main bitline load controllers 61 and 62 are turned off.

In the structure according to the second embodiment of the present invention, the path of the driving current according to the second method is formed by turning on two main bitline load controllers near the driving cell area and turning off the other main bitline load controller, as shown in FIG. 13B.

Referring to FIG. 13B, in this example when a cell in the uppermost sub cell array block 140_1 is driven, the first and second main bitline load controllers 61 and 62 are turned on while the third main bitline load controller 63 is turned off. In this case, the current path is formed along the uppermost sub cell array block in the first and second main bitline load controllers 61 and 62.

More generally, the entire cell array area is divided into two portions—upper or lower cell array areas. If the upper cell array area is driven, the first and second main bitline load controllers 61 and 62 are turned on and the third main bitline controller 63 is turned off. If the lower cell array area is driven, the second and third main bitline load controllers 62 and 63 are turned on and the first main bitline load controller 61 is turned off.

Furthermore, although not shown, in the structure of FIGS. 7A and 7B according to the third embodiment of the present invention, the main bitline load controllers are turned on/off by the above-described two methods in the same manner as the structure according to the second embodiment as shown in FIGS. 13A and 13B, thereby forming the current path. That is, according to the first method, the main bitline load controller of FIG. 7A nearest to the driving sub cell array block is turned on while all other main bitline load controller(s) are turned off. According to the second method, two main bitline load controllers nearest to the driving sub cell array block are turned on while all other main bitline load controller(s) are turned off.

The write mode operation and the read mode operation of the nonvolatile ferroelectric memory device according to the present invention will be described with reference to FIGS. 14 and 15.

Figure 14:
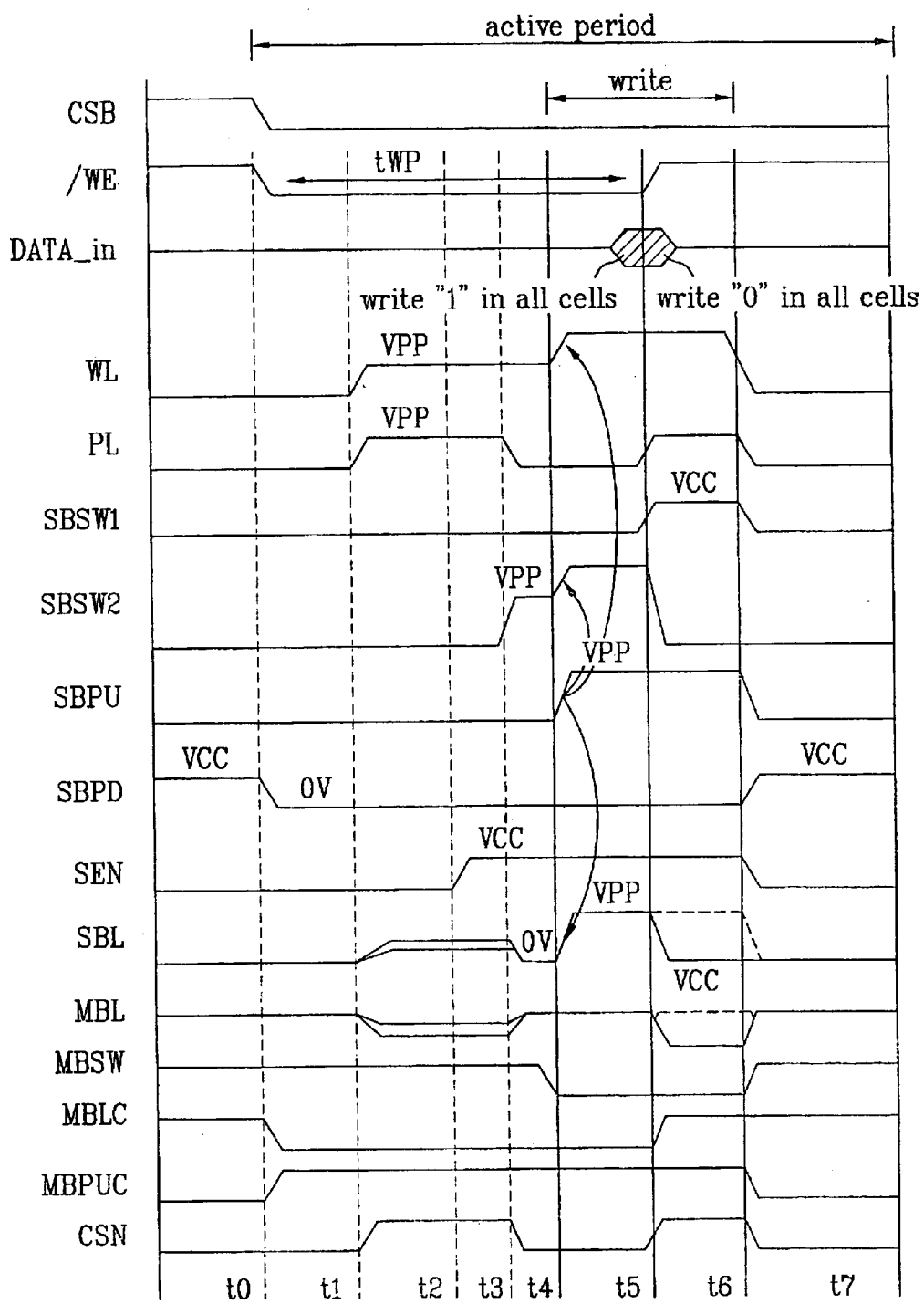
FIG. 14 illustrates a timing diagram of a write mode operation of the nonvolatile ferroelectric memory device according to an embodiment of the present invention.
Figure 15:
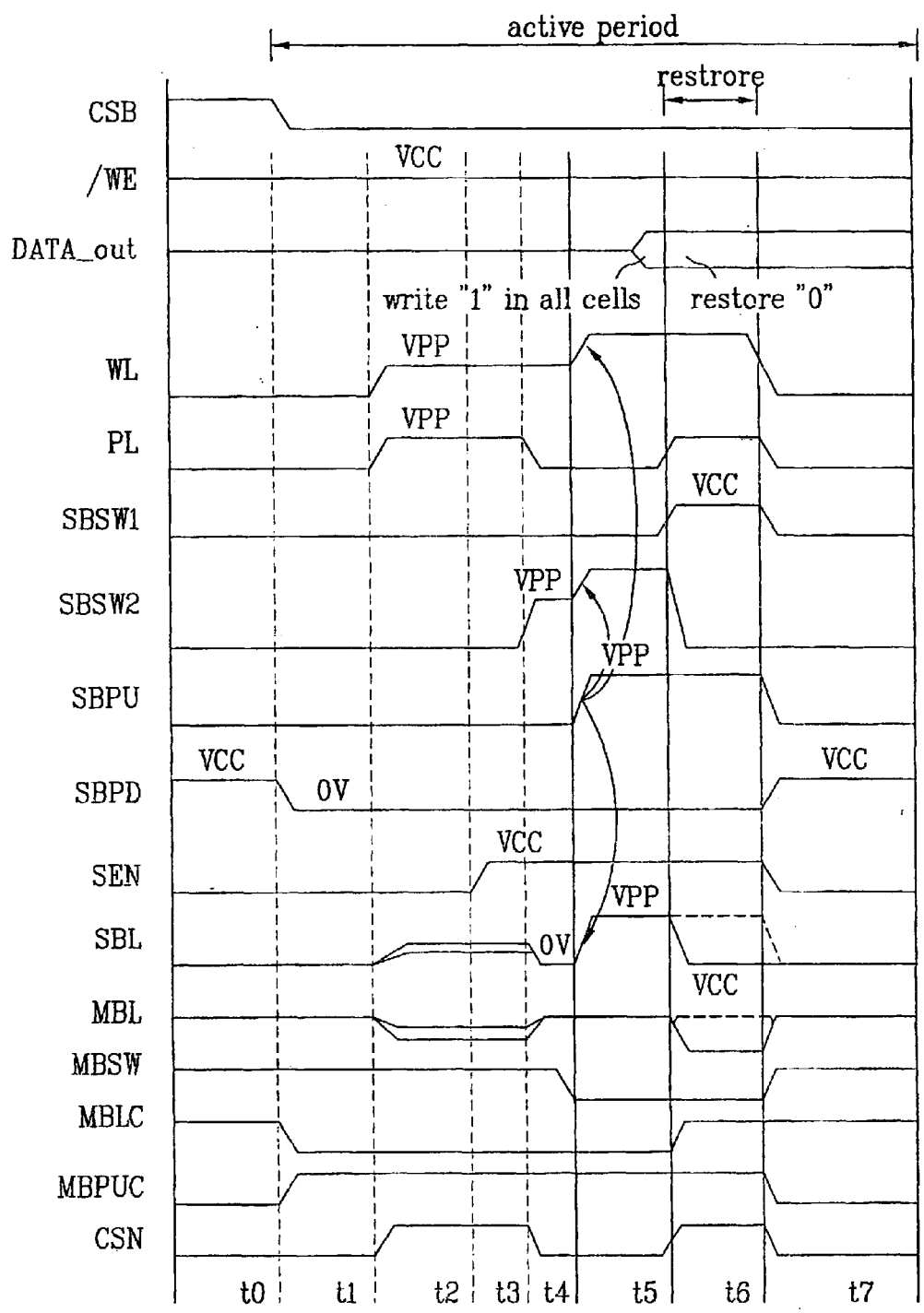
FIG. 15 illustrates a timing diagram of a read mode operation of the nonvolatile ferroelectric memory device according to an embodiment of the present invention.

FIG. 14 illustrates a timing diagram of the write mode operation of the nonvolatile ferroelectric memory device according to an embodiment of the present invention, and FIG. 15 illustrates a timing diagram of the read mode operation of the nonvolatile ferroelectric memory device according to an embodiment of the present invention.

The FRAM cell array according to am embodiment of the present invention includes a plurality of sub cell array blocks provided with sub bitlines and main bitlines.

The voltage stored in the cell is applied to the gate terminal of the fourth switching transistor ST4 through the sub bitline, so that the electric current value in the fourth switching transistor ST4 is varied depending on the data value of the cell. Thus, the data of the cell can be sensed by comparing the voltage of the main bitline connected with the drain terminal of the fourth switching transistor ST4 with the reference value.

The write mode operation of the nonvolatile ferroelectric memory device according to an embodiment of the present invention will now be described.

One cycle of the operation in the cell includes an active period and a precharge period. The active period is activated when the CSB is low. The precharge period is activated when the CSB is high.

The whole operational timing periods t0~t7 will be described. The period t0 denotes the precharge period while the periods t1~t7 denote successive active periods.

As shown in FIG. 14, in the period t0, VCC is applied to the sub bitline pull-down SBPD line to apply a voltage of 0V to the sub bitline SBL. At this time, the voltage of 0V is applied to the wordline WL, the plate line PL, the first and second sub bitline switching signal lines SBSW1 and SBSW2, the sub bitline pull-up signal SBPU line, the sensing amplifier enable signal SEN line, the main bitline pull-up control signal MBPUC line, and a CSN controlling the NMOS transistor of the column selector.

A voltage of high level is applied to the SBPD and the main bitline load control signal line MBLC.

In the period t1 in which the active period starts, the CSB line, the SBPD line, and the main bitline load control signal MBLC line are transited from a high level to a low level, the MBPUC is transited to a high level, and a signal of the period t0 is maintained in the other lines.

In the period t2, a VPP voltage is applied to the wordline WL and the plate line PL, and the voltage of the period t1 is maintained in the other lines.

Thus, the sub bitline SBL is transited to a high level. The fourth switching transistor ST4 is turned on so that the main bitline MBL is transited to low.

In the period t3, the wordline WL and the plate line PL are maintained at VPP, the sensing amplifier is enabled by applying VCC to SEN, and the signal of the period t2 is maintained in the other lines.

In the periods t2 and t3, the fourth switching transistor ST4 is turned on to sense the data stored in the cell.

In the period t4, the wordline WL is maintained at VPP, the plate line PL is transited from VPP to 0V, and the second sub bitline switching signal SBSW2 line is transited from 0V to VPP. 0V is applied to the sub bitline pull-up SBPU line so that the sub bitline SBL is maintained at a low level of 0V.

At this time, the SBSW2 is in advance transited to VPP in the period t4 to write data of logic value "1" in the ferroelectric capacitors of all the unit cells by self-boosting the wordline and the SBSW2 to 2VPP in the period t5.

In the period t5, the data of logic value "1" is written in all the cells. Once the SBPU is transited to VPP, the SBL is transited to VPP and the SBSW2 and the WL are self-boosted to 2VPP. At this time, the main bitline switching signal MBSW is transited to a low level. Thus, VPP is applied to the ferroelectric capacitor of the selected cell which received the VPP signal of the SBL.

In the periods t4 and t5, CSN is transited to a low level so that the main bitline is pulled up at a high level using a low signal of the MBLC line regardless of data of the data bus. At this time, the main bitline load controller nearest to the sub cell array block with the selected cell may be turned on by the low signal of the MBLC line. In the alternative, two main bitline load controllers adjacent to the sub cell array block with the selected cell may be turned on by the low signal of the MBLC line.

In the period t6, data of logic value "0" is written. High level is applied to the MBLC line before the write mode operation is performed, so that the main bitline load controller is turned off. At this time, the WL is maintained at 2VPP, the PL is transited to VPP, the SBSW1 is transited to VCC, and the SBSW2 is transited to 0V. Also, the SBPU is maintained at VPP level, and the SEN is maintained at VCC level.

As described above, the SBSW1 is maintained during the whole periods, except that it is transited to VCC level in only the period t6 so that the first switching transistor ST1 is turned on. At this time, since the transistor of the selected unit cell is turned on, VPP level of the PL is transferred to the gate of the fourth switching transistor ST4 through the SBL so that the fourth switching transistor is turned on. Thus, 0V is transferred to the main bitline MBL.

Also, since the first switching transistor ST1 is turned on, 0V of the main bitline MBEL is written in the cell through the sub bitline SBL.

The voltage is induced in the sub bitline SBL depending on data of the cell. 0V is transferred to the main bitline by applying the voltage to the fourth switching transistor and the data of logic value "0" can be written in the cell through the first switching transistor ST1.

Next, in the period t7, the same operation as that of the period t0 is performed.

In the above operation, since the boosted voltage higher than the VCC is used as the high voltage of the SBPU, the voltage used in the cell becomes higher even in the low voltage operation mode, thereby enabling the low voltage operation lower than 1.0V.

The cell operation time and the cycle time can be reduced by removing the time required for high data subsequent to the amplification of the sensing amplifier.

Even if the capacitance load of the main bitline is high, good sensing margin can be obtained by sensing electric current in the main bitline. Also, even if capacitance mismatching of the main bitline is generated, good sensing margin can be obtained.

The read mode operation of the nonvolatile ferroelectric memory device according to an embodiment of the present invention will be described.

As shown in FIG. 15, the read mode operation is almost similar to the write mode operation except that a write enable bar signal /WE is output at VCC level, and data of the cell is output to the data bus without writing the data in the cell.

When the data of the cell is "1" or "0", the read mode operation will be described.

If the data of the cell is high, the voltage of the sub bitline SBL becomes high during the sensing operation, so that the high current flows in the fourth switching transistor ST4. Thus, the main bitline voltage level becomes lower than the reference level.

On the contrary, if the data of the cell is low, the voltage of the SBL becomes low during the read operation, so that the low cur-rent flows in the fourth switching transistor ST4. Thus, the main bitline voltage level becomes higher than the reference level. That is to say, in the period t6, the SBSW1 is maintained at VCC level so that 0V is respectively applied to the SBL and the MBL by a feedback loop while the first switching transistor is turned on, thereby restoring "0" in the memory cell.

Before performing the restoring operation, in the periods t4 and t5, CSN is transited to a low level so that the main bitline is pulled up at a high level using the low signal of the MBLC line regardless of data of the data bus.

Although the main bitline load controllers and the main bitline pull-up blocks include NMOS and/or PMOS transistors, the present invention is not limited to such and the main bitline controllers and/or main bitline pull-up blocks may include other types of transistors or any other means capable of preducing the same results.

The aforementioned nonvolatile ferroelectric memory device and the method for operating the main bitline load controller thereof according to the present invention have the following advantages.

The main bitline load controllers are arranged between the respective sub cell array blocks so that only the main bitline load controller(s) nearest to the sub cell driving area is driven, thereby efficiently reducing the resistance component of the main bitline. Thus, the same sensing margin can be obtained anywhere in the semiconductor device without reducing the main bitline sensing voltage due to the main bitline resistance component.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A nonvolatile ferroelectric memory device comprising:
a plurality of cell array blocks provided with a plurality of sub cell array blocks having a plurality of unit cells;
a plurality of main bitlines arranged in the sub cell array blocks in one direction for each unit of column;
a plurality of sub bitlines connected with the unit cells to induce a voltage in the unit cells and arranged along the main bitlines;
a plurality of main bitline load controllers respectively arranged at least in the uppermost area and the lowest area of the sub cell array blocks so that one end of each of the main bitline load controllers is connected with the main bitline and the other end of said each of the main bitline load controllers is connected with a high level applying terminal;
a sensing amplifier block including a plurality of sensing amplifiers commonly used in the cell array blocks and amplifying signals of the main bitlines; and
switching transistors arranged one per sub bitline to sense data values of the unit cells using current by varying a current flow depending on the voltage induced in the sub bitline and a voltage transferred to the main bitlines.

2. The nonvolatile ferroelectric memory device of claim 1, wherein the main bitline load controller is additionally arranged in an intermediate area of the sub cell array blocks.

3. The nonvolatile ferroelectric memory device of claim 1, wherein the main bitline load controllers are additionally arranged in intermediate areas of the sub cell array blocks so that at least two sub cell array blocks are arranged between the respective main bitline load controllers.

4. The nonvolatile ferroelectric memory device of claim 1, wherein the main bitline load controllers are PMOS transistors driven under the control of respective main bitline load control signal lines.

5. The nonvolatile ferrooelectric memory device of claim 1, wherein each of the switching transistors includes a gate connected with the corresponding sub bitline, a drain connected with the corresponding main bitline, and a source connected with a ground voltage terminal.

6. The nonvolatile ferroelectric memory device of claim 1, further comprising another switching transistor having a source connected with the ground voltage terminal, a gate connected with a main bitline switching signal line, and a drain used in common with the source terminals of the respective switching transistors, thereby preventing current leakage when writing data.

7. A nonvolatile ferroelectric memory device comprising:
a plurality of cell array blocks provided with a plurality of sub cell array blocks having a plurality of unit cells;
a plurality of main bitlines arranged in the sub cell array blocks in one direction for each unit of column;

a plurality of sub bitlines connected with the unit cells to induce a voltage in the unit cells of the sub cell array blocks and arranged along the main bitlines;

a plurality of main bitline load controllers arranged at least in lower and upper areas of the sub cell array blocks so that one end of each of the main bitline load controllers is connected with the main bitlines and the other end of said each of the main bitline load controllers is connected with a high level applying terminal;

a sensing amplifier block including a plurality of sensing amplifiers commonly used in the cell array blocks and amplifying signals of the main bitlines; and switching control blocks including first, second, and third switching transistors controlling whether to connect the sub bitlines and the main bitlines with the sub cell array blocks and controlling pull-up and pull-down of the sub bitlines;

a fourth switching transistor controlled by the sub bitlines having the voltage value induced from the unit cells and sensing the voltage of the main bitlines by varying a current value depending on data values of the unit cells;

a column selector block including a plurality of column selectors corresponding to the sub cell array blocks;

a reference generator block including a plurality of reference generators corresponding to the sensing amplifiers; and a main bitline pull-up block pulling up the main bitlines.

8. The nonvolatile ferroelectric memory device of claim 7, wherein the main bitline load controller is additionally arranged in an intermediate area of the sub cell array blocks.

9. The nonvolatile ferroelectric memory device of claim 7, wherein the main bitline load controllers are additionally arranged in intermediate areas of the sub cell array blocks so that at least two sub cell array blocks are arranged between the respective main bitline load controllers.

10. The nonvolatile ferroelectric memory device of claim 7, wherein the main bitline load controllers are PMOS transistors driven under the control of respective main bitline load control signal lines.

11. The nonvolatile ferroelectric memory device of claim 7, further comprising a fifth switching transistor having a source connected with a ground voltage terminal, a gate connected with a main bitline switching signal line, and a drain used in common with the source terminal of the respective fourth switching transistor, thereby preventing current leakage when writing data.

12. The nonvolatile ferroelectric memory device of claim 7, wherein the sub cell array blocks have a hierarchical folded bitline structure, so that the unit cells are alternately arranged so as not to overlap with one another if the cell array blocks are folded around the main bitlines, cells in each row are arranged per two columns, cells in each column are arranged per two rows, and a plate line is commonly used between two wordlines.

13. The nonvolatile ferroelectric memory device of claim 12, wherein the adjacent second switching transistors are operated under the control of different signals.

14. The nonvolatile ferroelectric memory device of claim 7, wherein the sub cell array blocks have a hierarchical open bitline structure, so that the unit cells are arranged so as to overlap with one another if the cell array blocks are folded around the main bitlines, cells in each row are arranged per column, and cells in each column are arranged per row.

15. The nonvolatile ferroelectric memory device of claim 7, wherein the first to fourth switching transistors are NMOS transistors.

16. The nonvolatile ferroelectric memory device of claim 7, wherein the cell array blocks, the column selector block, and the main bitline pull-up block are symmetrically arranged at lower and upper portions of the sensing amplifier block.

17. A method for operating a main bitline load controller of a nonvolatile ferroelectric memory device, the method comprising:

preparing the nonvolatile ferroelectric memory device which includes a plurality of sub cell array blocks having a plurality of unit cells, and a plurality of cell array blocks provided with main bitline load controllers driven by a main bitline load control signal at the uppermost and lowest areas of the sub cell array blocks;

selecting a cell driving area; and turning on at least one main bitline load controller nearest to the sub cell array block corresponding to the selected cell driving area.

18. The method of claim 17, wherein, in the turning on step, two main bitline load controllers adjacent to the sub cell array block corresponding to the selected cell driving area are turned on.

19. The method of claim 17, wherein when first and second main bitline load controllers are arranged at the uppermost and lowest areas of the sub cell array blocks, the cell array block is divided into upper and lower sub cell array areas, so that, in the turning step, the first main bitline load controller is turned on if the upper sub cell array area is driven while the second main bitline load controller is turned on if the lower sub cell array area is driven.

20. The method of claim 17, wherein when first and second main bitline load controllers are arranged at the uppermost and lowest areas of the sub cell array blocks, the first and second main bitline load controllers are all turned on regardless of whichever sub cell array block is driven.

21. The method of claim 17, wherein when first and third main bitline load controllers are arranged at the uppermost and lowest areas of the sub cell array blocks and at least one second main bitline load controller is arranged at intermediate areas of the sub cell array blocks, the cell array block is divided into three areas, so that the first main bitline load controller is only turned on if a cell in an upper sub cell array area corresponding to top $\frac{1}{3}$ area of the cell array block is driven, the second main bitline load controller is only turned on if a cell in an intermediate sub cell array area corresponding to $\frac{1}{3}$~$\frac{2}{3}$ area of the cell array block is driven, and the third main bitline load controller is only turned on if a cell in a lower sub cell array area corresponding to bottom $\frac{1}{3}$ area of the cell array block is driven.

22. The method of claim 17, wherein the cell array block is divided into upper and lower sub cell array areas, so that both first and second main bitline load controllers are turned on if the upper sub cell array area is driven while the second and third main bitline load controllers are turned on if the lower sub cell array area is driven.

* * * * *